United States Patent [19]
Puchianu

[11] Patent Number: 6,133,709
[45] Date of Patent: *Oct. 17, 2000

[54] SIGNALLING SYSTEM

[75] Inventor: Silviu Puchianu, Aberdeen, United Kingdom

[73] Assignee: Metrixx Limited, Aberdeen, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 09/362,624

[22] Filed: Jul. 20, 1999

Related U.S. Application Data

[63] Continuation-in-part of application No. PCT/GB98/00170, Jan. 20, 1998.

[30] Foreign Application Priority Data

| Jan. 21, 1997 | [GB] | United Kingdom | 9701165 |
| Aug. 22, 1997 | [GB] | United Kingdom | 9717967 |
| Sep. 19, 1997 | [GB] | United Kingdom | 9720037 |
| Jul. 21, 1998 | [GB] | United Kingdom | 9815899 |
| Nov. 26, 1998 | [GB] | United Kingdom | 9825954 |

[51] Int. Cl.[7] .................................................. H01M 10/46
[52] U.S. Cl. ......................................................... 320/116
[58] Field of Search .................................... 320/116, 118, 320/119, 120, 121, 122, FOR 105, FOR 114, FOR 116, FOR 117

[56] References Cited

U.S. PATENT DOCUMENTS

| 4,217,645 | 8/1980 | Barry et al. . |
| 4,250,484 | 2/1981 | Parke . |
| 4,553,081 | 11/1985 | Koenck . |
| 4,590,430 | 5/1986 | Vandenberghe et al. . |
| 4,697,134 | 9/1987 | Burkum et al. . |
| 5,543,245 | 8/1996 | Andrieu et al. . |
| 5,578,927 | 11/1996 | Perelle . |
| 5,608,325 | 3/1997 | Chabbert et al. . |

FOREIGN PATENT DOCUMENTS

| 0 657 745 A1 | 6/1995 | European Pat. Off. . |
| 2 072 467 A1 | 9/1981 | United Kingdom . |
| 2 111 273 | 6/1983 | United Kingdom . |
| 2 297 410 | 7/1996 | United Kingdom . |
| 2 304 440 | 3/1997 | United Kingdom . |
| WO 8300740 | 3/1983 | WIPO . |
| Wo 9308629 | 4/1993 | WIPO . |
| WO 94/01784 | 1/1994 | WIPO . |
| 0 637 754 A1 | 2/1995 | WIPO . |
| WO 95/04937 | 2/1995 | WIPO . |

*Primary Examiner*—Edward H. Tso
*Attorney, Agent, or Firm*—Frishauf, Holtz, Goodman, Langer & Chick, P.C.

[57] ABSTRACT

A battery signalling system is provided which can be used to monitor and/or control a battery (1) having a number of series connected battery cells ($C_i$). When used to monitor the battery cells, the battery signalling system can comprise a central battery monitoring system (3) for monitoring the industrial battery (1) as a whole, a number of cell monitoring devices ($CM_i$) for monitoring one or more battery cells ($C_i$) and a communication link (9) for connecting the cell monitoring devices ($CM_i$) in series in a daisy chain configuration to the central battery monitoring system (3). In operation, the central battery monitoring system (3) can poll each of the cell monitoring devices ($c_{mi}$) in turn and analyze the data received from a polled cell monitoring device ($CM_i$) to detect malfunctions and/or underperforming cells.

42 Claims, 14 Drawing Sheets

6,133,709

SIGNALLING SYSTEM

This application is a CIP patent application of International Application PCT/GB98/00170 filed Jan. 20, 1998.

FIELD OF THE INVENTION

The present invention relates to a signalling system. The invention is applicable for use in a system for monitoring and/or controlling the cells of an industrial battery.

BACKGROUND OF THE INVENTION

Industrial batteries comprise a number of rechargeable battery cells which can be electrically connected in various series and series-parallel combinations to provide a rechargeable battery having a desired output voltage. To recharge the battery, a current is passed through the cells in the opposite direction of current flow when the cells are working. There are many different types of battery cells available, but those most commonly used in industrial applications are lead acid battery cells, each of which provides 2 volts, and nickel-cadmium (Nicad) battery cells, each of which provides 1.2 volts.

The batteries are usually used as a back-up power supply for important systems in large industrial plants, such as off-shore oil rigs, power stations and the like. Since the batteries are provided as back-up in the event of a fault with the main generators, they must be constantly monitored and maintained so that they can provide power to the important systems for a preset minimum amount of time.

Many battery monitoring systems have been proposed which monitor the battery as a whole and provide an indication of the battery voltage. However, only a few systems have been proposed which can also monitor the individual cells which make up the battery. These systems use a number of monitoring devices, some of which are powered by the battery cell or cells which they monitor and send status information indicative of the cell voltage back to a central battery monitory system which monitors the battery as a whole.

However, since the cells are connected in series and since each cell monitoring device is powered by the cell which it is monitoring, the ground or reference voltage of each cell monitoring device is different. For example, in an industrial battery which has sixty lead acid cells connected in series, the negative terminal, i.e. the ground, of the fifth cell will be at a potential of approximately 8 volts and the positive terminal will be at a potential of approximately 10 volts, whereas the negative terminal of the seventh cell will be at a potetial of approximately 12 volts and the positive terminal will be at a potential of approximately 14 volts. This has lead to the common misconception in the art that the cell monitoring devices have to be electrically isolated from each other and from the central battery monitoring system.

In one known cell monitoring system, each cell is independently linked to its own electrically isolated input at the central monitoring system. The problem with this system is that a large number of connectors are needed to link the individual cell monitoring devices to the central monitoring system. Consequently, in practice, it is seldom used for permanent real-time monitoring of the battery cells.

In another known cell monitoring system, each cell monitoring device is serially linked to its neighbours in a daisy-chain configuration, either by using optical links between the monitoring devices or by using transformers which have no DC path. The problem with this system is that to operate, each of the cell monitoring devices requires either an electrical to optical and an optical to electrical converter or a modulator and a demodulator, which makes them relatively expensive and inefficient since this additional circuitry requires more power from the cell.

There is therefore a need to provide a simple cell monitoring device which can monitor and report on the status of the cells of the battery, but which consumes minimal power from the cell which it is monitoring.

As mentioned above, existing battery monitoring systems monitor the battery and provide an indication of the battery voltage. However, battery voltage is not an indication of the capacity of the battery, i.e. the ability of the battery to provide energy. There is therefore also a need to provide a battery monitoring system which can give the user a fairly accurate estimate of how much load he can place on a battery and over what period of time.

SUMMARY OF THE INVENTION

The inventor has realised that it is possible to overcome the problem of having the cell monitoring devices operating at different voltages using simple electronic components and that therefore, there is no need for electrical isolation between the individual cell monitoring devices and the central monitoring system.

According to a first aspect, the present invention provides a signalling system for use with a plurality of series connected battery cells, comprising: a plurality of cell signalling devices, each to be powered by a respective one or more of the plurality of battery cells; and a communication link connecting the plurality of cell signalling devices in series; wherein each cell signalling device comprises a level shift circuit which is operable to receive signals transmitted from an adjacent cell signalling device to shift the level of the received signal and to output the level shifted signal for transmission to the communication link. By providing a level shift circuit in each cell signalling device, the cell signalling devices can be linked together in a communication link without the need for electrical isolation between the signalling devices.

The signalling system can be used as part of a battery monitoring and/or control system which is used to monitor and/or control the series connected battery cells. By providing the level shift circuit in each cell signalling device, the signalling system obviates the need for electrical isolation between individual cell signalling devices. Consequently, the communication link can be a simple one-wire communication bus.

Preferably each of the cell signalling devices is able to receive communications from and transmit communications to the communication link so that they can communicate with, for example, the battery monitoring and/or control system. In which case, each cell signalling device can comprise two DC level shift circuits, one for increasing the level of the received signals for transmission to a cell signalling device having a higher ground potential than that of the receiving cell signalling device, and one for reducing the level of the received signals for transmission to a cell signalling device which has a lower ground potential than that of the receiving cell signalling device.

Each level shift circuit can comprise a simple electronic device, such as a comparator, which consumes a relatively small amount of power from the battery cell which powers the cell signalling device.

The first aspect of the present invention also provides a cell signalling device for use in the above defined signalling system, comprising: a power input terminal connectable to the cell or cells which is or are to power the cell signalling device; and at least one DC level shift circuit for receiving signals from an adjacent cell signalling device, for shifting the level of the received signal, and for outputting the level shifted signal for transmission to the communication link.

The first aspect of the present invention also provides a signalling kit comprising a plurality of the cell signalling devices defined above. The kit may also comprise the communication link for connecting the cell signalling devices in series.

The first aspect of the present invention also provides a signalling method using a plurality of series connected battery cells, comprising the steps of: providing a plurality of cell signalling devices and powering them with a respective one or more of the plurality of battery cells; providing a communication link which connects the plurality of cell signalling devices in series; receiving signals transmitted from an adjacent cell signalling device; shifting the level of the received signals; and outputting the level shifted signals to the communication link.

BRIEF DESCRIPTION OF THE DRAWINGS

The present invention will now be described, by way of example only, with reference to the accompanying drawings, in which.

DETAILED DESCRIPTION OF THE PREFERRED EMBODIMENT

Figure 1:
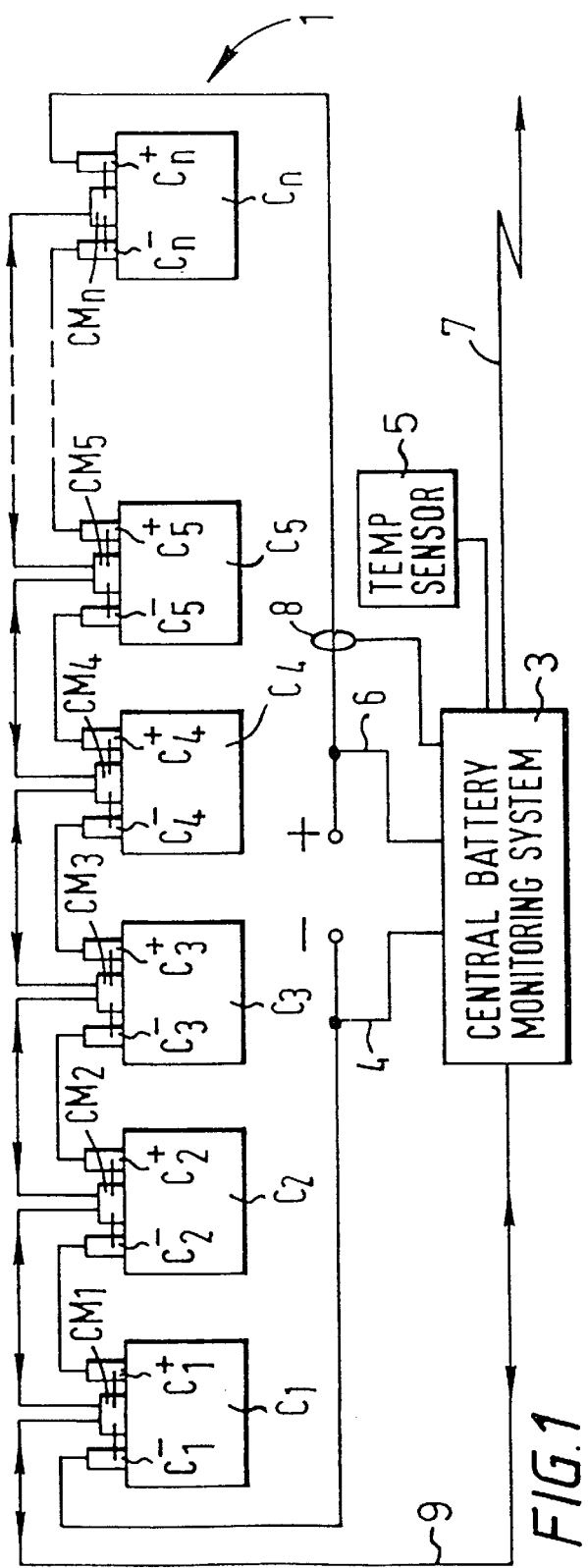
FIG. 1 schematically shows a battery comprising a number of battery cells connected in series, a central battery monitoring system for monitoring the condition of the battery as a whole and individual cell monitoring devices for monitoring the cells of the battery.

A first embodiment of the present invention will now be described with reference to FIGS. 1 to 5. FIG. 1 schematically shows an industrial battery, generally indicated by reference numeral 1, comprising a number of lead acid battery cells $C_1, C_2, C_3 \ldots C_n$ connected so that the negative terminal $C_i^-$ of cell $C_i$ is connected to the positive terminal $C_{i-1}^+$ of preceding cell $C_{i-1}$ and the positive terminal $C_i^+$ of cell $C_i$ is connected to the negative terminal $C_{i+1}^-$ of the succeeding cell $C_{i+1}$, whereby the negative terminal $C_{i+1}^-$ of the first cell $C_1$ is the negative terminal of the battery and the positive terminal $C_n^+$ of the last cell $C_n$ is the positive terminal of the battery. Since the battery cells are lead acid, they each provide approximately 2 volts and the voltage of the battery as a whole will be approximately 2n volts. For industrial applications a voltage of 120 volts is often required. Therefore, 60 series connected lead acid or 100 series connected Nicad battery cells would be required. Sometimes, each cell in the series connection is connected in parallel with one or more similar cells, so as to provide redundancy, so that the battery will not fail if a single cell fails.

FIG. 1 also shows a central battery monitoring system 3 which is powered by the battery 1 via connectors 4 and 6, which connect the central battery monitoring system 3 to the negative terminal $C_1^-$ and the positive terminal $C_n^+$ of the battery 1, respectively. The battery monitoring system 3 monitors the status of the industrial battery 1 as a whole, based on charging and discharging characteristics of the battery (determined by monitoring the battery voltage from connectors 4 and 6 and the current being drawn from or supplied to the battery 1, which is sensed by current sensor 8, whilst the battery is being charged and subsequently discharged), the ambient temperature (input from temperature sensor 5) and on information relating to the efficiency characteristics of the battery cells (provided by the battery cell manufacturer). The monitoring results can be stored in the central battery monitoring system 3 or they can be transmitted to a remote user (not shown) via the telephone line 7.

Each of the battery cells $C_i$, shown in FIG. 1, also has a battery cell monitoring device $CM_i$ mounted on top of the cell between its positive and negative terminals Ci+ and $C_i^-$ respectively, which monitors the status of the cell $C_i$. Each cell monitoring device $CM_i$ is powered by the cell $C_i$ which it monitors and communicates with the central battery monitoring system 3 via a simple one-wire communication link 9. The communication link 9 links the cell monitoring devices $CM_i$. in series in a daisy chain configuration to the central battery monitoring system 3, so that communications from the central battery monitoring system 3 to the cell monitoring devices $CM_i$ pass from left to right along the communication link 9 and communications from the cell monitoring devices $CM_i$ to the central battery monitoring system 3 pass from right to left along the communication link 9. Each cell monitoring device $CM_i$ has its own cell identification or address, which, in this embodiment, is set in advance using DIP-switches mounted in the device. This allows communications from the central battery monitoring system 3 to be directed to a specific cell monitoring device and allows the central battery monitoring system 3 to be able to identify the source of received communications.

The battery monitoring system shown in FIG. 1 operates in two modes. In the first mode, the central battery monitoring system 3 monitors the condition of the industrial battery 1 as a whole and polls each of the cell monitoring devices $CM_i$ in turn. During this mode, each of the cell monitoring devices $CM_i$ listens to communications from the central battery monitoring system 3 on the communication link 9 and responds when it identifies a communication directed to it. When polled, each cell monitoring device $CM_i$ performs a number of tests on the corresponding battery cell $C_i$ and returns the results of the tests back to the central battery monitoring system 3 via the communication link 9.

In the second mode of operation, the central battery monitoring system 3 listens for communications on the communication link 9 from the cell monitoring devices $CM_i$ indicating that there is a faulty condition with one of the battery cells $C_i$. In this second mode of operation, each cell monitoring device $CM_i$ continuously monitors the corresponding battery cell $C_i$ and, upon detection of a faulty condition, checks that the communication link 9 is free and then sends an appropriate message back to the central battery monitoring system 3 via the communication link 9.

Figure 2:
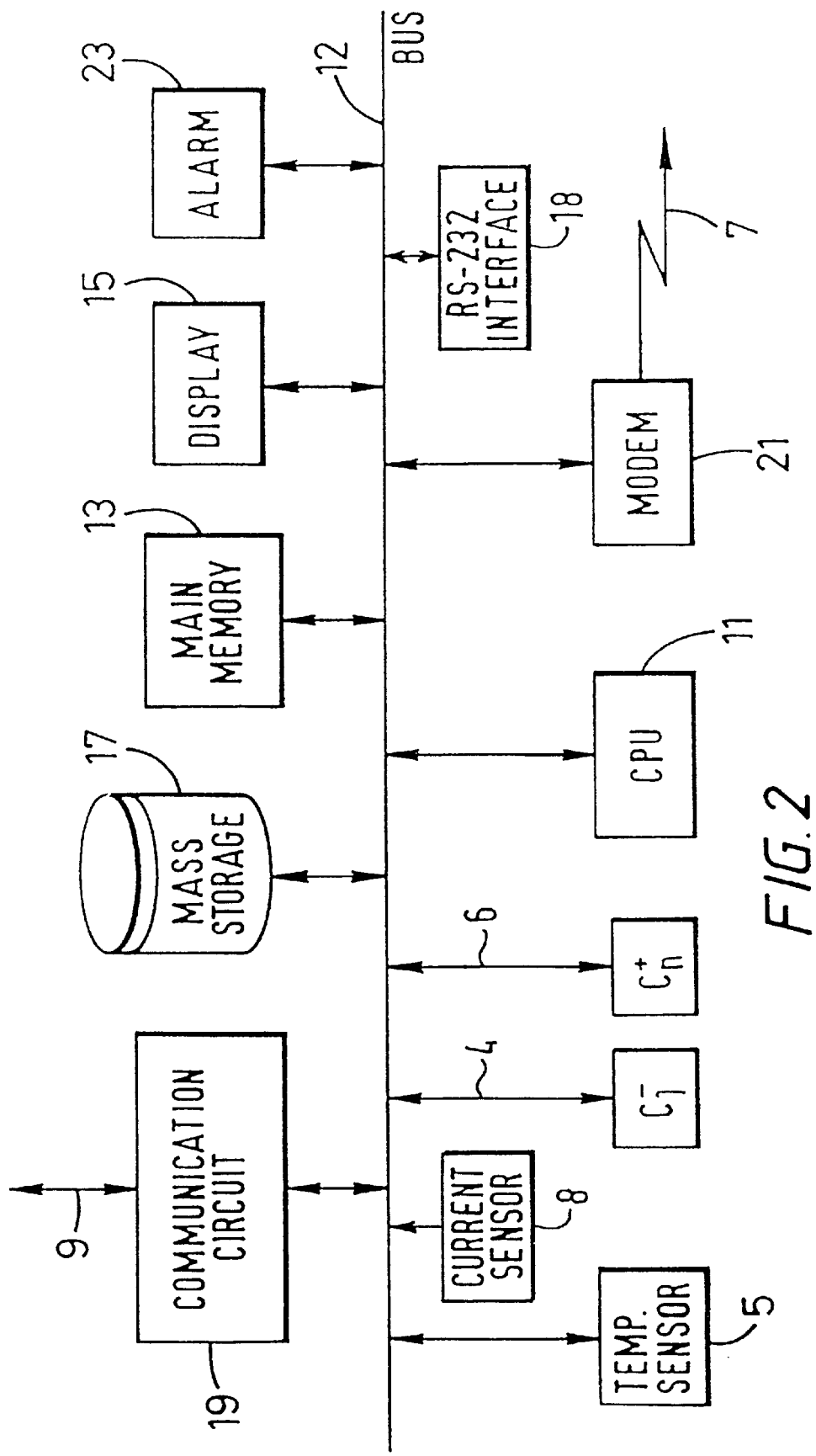
FIG. 2 is a schematic diagram showing more detail of the central battery monitoring system shown in FIG. 1.

FIG. 2 is a schematic diagram of the central battery monitoring system 3 shown in FIG. 1. As shown, the central battery monitoring system 3 comprises a CPU 11 for controlling the operation of the central battery monitoring system 3. The CPU 11 is connected, via data bus 12, to a main memory 13 where data from the input sensors is stored and where test programs are executed, to a display 15 which displays the battery's current status and to a mass storage unit 17 for storing the sensor data and the results of the battery tests. The mass storage unit 17 can be fixed within the central battery monitoring system 3, but is preferably a floppy disk or a PCMIA memory card which can be withdrawn and input into an operator's personal computer for analysis. An operator can also retrieve the stored data and results and control the set up and initialisation of the central battery monitoring system 3 via the RS-232 serial interface 18. As mentioned above, instead of storing the test results in the mass storage unit 17, they can be transmitted via a modem 21 and telephone line 7 to a remote computer system (not shown) for display and/or analysis.

The central battery monitoring system measures the total battery capacity in Amp-hours (Ahr) or Watt-hours (Whr), the actual or remaining battery capacity as a percentage of the total battery capacity and the internal resistance of the battery 1 as a whole. The cental battery monitoring system 3 can also measure the internal resistance of the individual cells from the data received from the individual cell monitoring devices $CM_i$ received via the communication link 9 and the communication circuit 19.

In order to be able to measure the total battery capacity, i.e. the maximum amount of charge which can be stored in the battery, and the actual or remaining battery capacity at a given time point as a percentage of the total battery capacity, the central battery monitoring system 3 monitors how much charge is fed into the battery and how much charge is drawn from the battery. Unfortunately, since the charging and discharging characteristics of the battery are not one hundred percent efficient. Therefore, the estimated capacity derived by monitoring the charge alone is not very accurate. In fact, various factors affect the amount of charge which is input to or drawn from a battery during charging/discharging, including the ambient temperature, the magnitude of the charging/discharging current, the algorithm used for charging etc. Fortunately, many of these characteristics are known to the battery manufacturer and, in this embodiment the specific characteristics of the battery 1 are programmed into the central battery monitoring system 3. With this information, it is possible to determine more accurately how much charge has been stored in or withdrawn from the battery 1.

For example, if the battery 1 is charged with a charging current of 10 amps over a period of two hours at an ambient temperature of 20° C., and it is known that the efficiency characteristic of the battery is 95% for such a level of charging current and for that ambient temperature, then the total charge supplied to the battery is 19 Ahr. In the general case, for a current (I(t)) drawn from or supplied to the battery, the capacity (CP) added to or removed from (depending on whether the current is negative or positive) the battery from time $t_0$ to time $t_1$ is given by:

$$CP[t_0, t_1] = (k_1 \times k_2 \times k_3) \cdot \int_{t_0}^{t_1} I(t) dt \qquad (1)$$

where $k_i$ are the efficiency characteristics for the battery 1 for the sensed conditions and where I(t) is negative when the current is being drawn from the battery 1.

In order to determine the initial total battery capacity (TCP), the battery 1 is initially fully charged by charging the battery for a long period of time using a small charging current. Then the battery 1 is discharged through a load (not shown) until the battery voltage drops below an end of discharge voltage limit (EODV) which is specified by the battery manufacturer. During this discharging period, the central battery monitoring system 3 monitors the discharge current via current sensor 8, and once the EODV limit is reached, it calculates the capacity (in Amp-hours) which has been removed from the battery using equation 1 above, with to being the time that the discharge is initiated and time t, is the time that the EODV limit is reached. This capacity represents the total battery capacity (TCP).

In this embodiment, the central battery monitoring system 3 periodically determines the remaining battery capacity (RCP) as a percentage of the total battery capacity (TCP) by monitoring the amount of current which is drawn from and/or supplied to the battery 1 since the last time the remaining battery capacity was determined and then by using the following equation:

$$RCP[t_1] = RCP[t_0] + \frac{100 \cdot CP[t_0, t_1]}{TCP} \qquad (2)$$

Where $CP[t_0, t_1]$ is calculated using equation 1 above. The initial estimate for the remaining battery capacity is set equal to the total working capacity of the battery after the battery has been fully charged.

To determine the internal resistance of the battery as a whole, the battery is connected to two different loads and the central battery monitoring system 3 monitors the current through the loads from which it determines the internal resistance of the whole battery.

As mentioned above, in addition to determining the total battery capacity, the remaining battery capacity and the battery internal resistance, the central battery monitoring system 3 also monitors data received from the cell monitoring devices $CM_i$ via the communication circuit 19 and the communication link 9. If there is a fault with one of the battery cells $C_i$ or if there is some other faulty condition, the CPU 11 can trigger a local alarm 23 to alert a technician that there is a fault with the battery 1 or with one or more of the battery cells $C_i$. In this embodiment, the conditions which define a fault and their thresholds are user definable and set in advance.

Although the central battery monitoring system 3 continuously monitors the battery 1, the sensor data and the other battery data, i.e. the remaining battery capacity etc., are only stored periodically in the mass storage unit 17 in order to save storage space. The period is specified in advance by the user and in this embodiment is set at ten seconds. Furthermore, when the samples are stored, they are time and date stamped so that the battery charging and discharging behaviour can be monitored and used to detect the cause of an eventual battery failure. In this embodiment, the data which is to be stored is also filtered in order to try to identify and highlight important events, and the filtered data is also stored in the mass storage unit 17. What counts as an important event is user definable, but can be, for instance, a temperature increase of 2° C. or a change in remaining battery capacity of greater than 1% of the total battery capacity.

As mentioned above, the status data of the battery, i.e. the battery voltage, the discharge/charge current, the battery temperature and the remaining and total battery capacities, are displayed on display 15. For simplicity, since the display 15 does not need to be continuously updated, it is only updated using the samples of the status data which are to be stored in mass storage unit 17. Therefore, in this embodiment, the display 15 is updated every ten seconds.

In this embodiment, the central battery monitoring system 3 is also used to control the battery charger (not shown) which is used to charge the battery 1. In particular, the central battery monitoring system 3 monitors the charging current, the remaining battery capacity, the ambient temperature etc. and controls the operation of the charger (not shown) so that the battery charging is in accordance with the specific charging procedures recommended by the battery manufacturer for the battery 1.

Since the total battery capacity also decreases with time (due to ageing), the central battery monitoring system 3 is programmed to perform regular (for example daily or monthly) automated measurements of the total battery capacity and the battery internal resistance using the procedures outlined above. This allows the central battery monitoring system 3 to be able to build up a picture of the battery life characteristics and to be able to predict the battery end of life and the early detection of faulty conditions.

Figure 3:
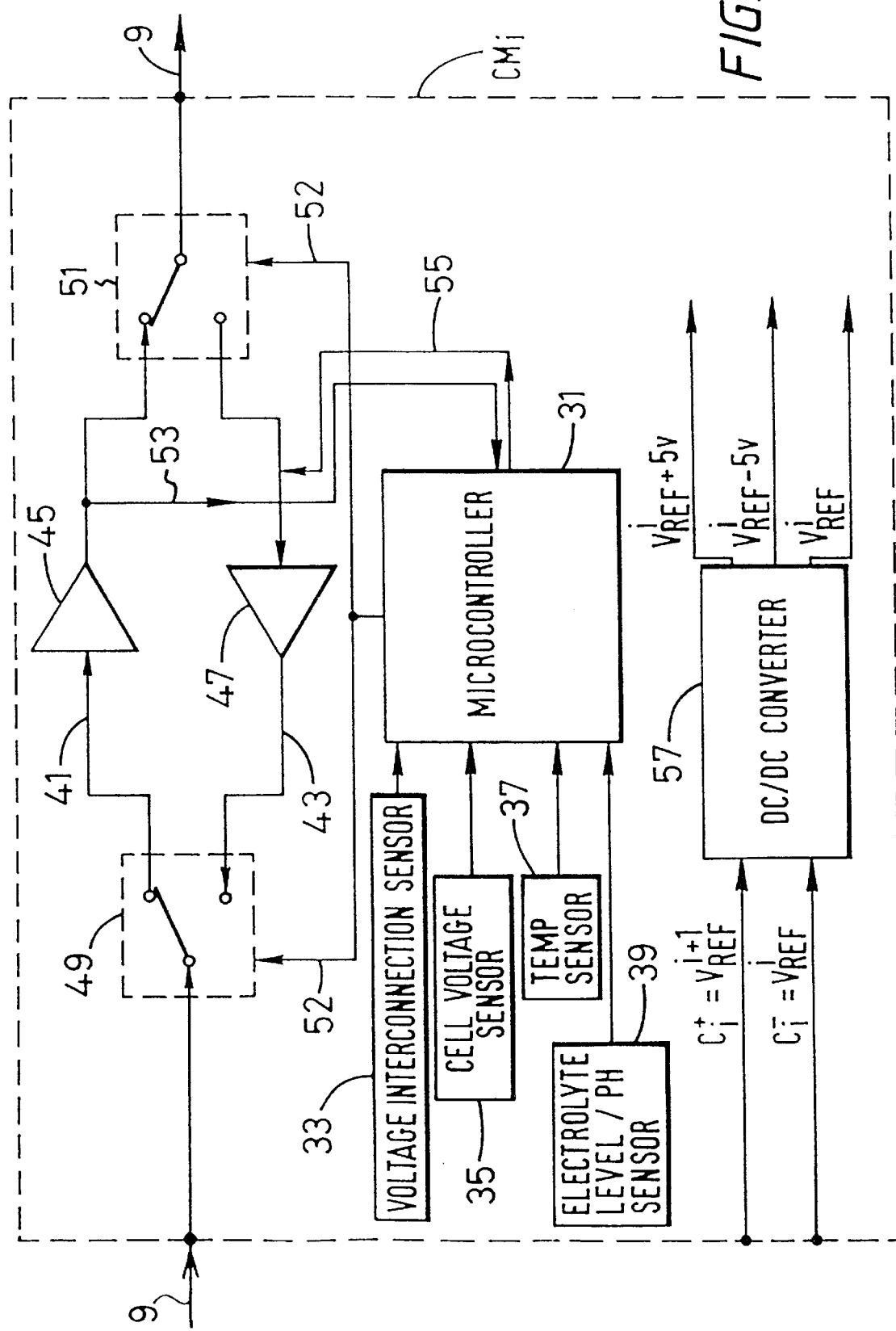
FIG. 3 is a schematic diagram of one of the cell monitoring devices shown in FIG. 1.

FIG. 3 is a schematic diagram showing, in more detail, one of the cell monitoring devices $CM_i$. As shown, cell monitoring device $CM_i$ comprises a microcontroller 31 for controlling the operation of the cell monitoring device $CM_i$ and for analysing sensor data received from voltage interconnection sensor 33, cell voltage sensor 35, temperature sensor 37 and electrolyte level/PH sensor 39.

The voltage interconnection sensor 33 measures the voltage drop between the cell being monitored and its neighbouring cells, by measuring the potential difference between each terminal of the cell $C_i$ and the respective terminal connections which connects cell $C_i$ with its neighbouring cells. Ideally, there should be no voltage drop between each terminal and the corresponding terminal connection. However, due to chemical deposits accumulating at the cell terminals with time, or because of cell malfunction, a difference in potential between the cell terminals and the corresponding connectors sometimes exists, indicating that there is a fault, either with the battery cell $C_i$ or with the interconnection with a neighbouring cell.

The cell voltage sensor 35 is provided for sensing the potential difference between the positive terminal $C_i^+$ and the negative terminal $C_i^-$ of the cell $C_i$ which it is monitoring. The temperature sensor 37 senses the cell temperature locally at the cell $C_i$. By monitoring the local temperature at each cell $C_i$, it is possible to identify quickly faulty cells or cells which are not operating efficiently. The electrolyte level/PH sensor senses the electrolyte level and/or the electrolyte PH of the battery cell $C_i$ which it is monitoring.

The microcontroller 31 analyses the data input from the sensors and monitors for faulty conditions and reports to the central battery monitoring system 3 via the communication link 9. Since the microcontroller 31 processes digital data, and since the signals received from the sensors and the messages received from the battery monitoring system 3 are analogue signals, the microcontroller 31 has a built-in analogue to digital convertor (not shown) so that it can convert the sensor data and the received messages into corresponding digital signals.

Since the cell monitoring devices are connected in series by the communication link 9, each cell monitoring device $CM_i$ will either receive communications originating from the central battery monitoring system 3, from the left hand side of the communication link 9 for transmission to the next cell monitoring device $CM_{i+1}$, or they will receive communications from cell monitoring device $CM_{i+1}$ from the right hand side of the communication link 9 for transmission back to the central battery monitoring system 3. In order to compensate for the difference in reference voltages between each of the cell monitoring devices $CM_i$, each cell monitoring device $CM_i$ has an up-link 41 for transmitting data received from cell monitoring device $CM_{i-1}$ to cell monitoring device $CM_{i+1}$, and a down-link 43 for transmitting data received from cell monitoring device $CM_{i+1}$ to cell monitoring device $CM_{i-1}$.

The up-link 41 has a transceiver 45 for increasing the reference voltage of the data signal so that it can be received by the next cell monitoring device $CM_{i+1}$, while the down-link 43 has a transceiver 47 which reduces the reference voltage of the received data so that it can be received by the cell monitoring device $CM_{i-1}$. The up-link 41 and the down-link 43 are connected to the one wire communication link 9 via switches 49 and 51 which are controlled by microcontroller 31, as represented by arrows 52. The way in which the microcontroller 31 controls the position of the switches 49 and 51 for the above described two modes of operation will be apparent to those skilled in the art and will not be described here. The microcontroller 31 is connected to the up-link 41 by connection 53 so that it can listen for communications sent from the central battery monitoring system 3 which are directed to it. Similarly, the microcontroller 31 is connected to the down-link 43 by connection 55 so that the microcontroller 31 can send messages back to the central battery monitoring system 3, either upon being polled or upon detection of a fault.

In order to power the cell monitoring device $CM_i$, the positive terminal $C_i^+$ and the negative terminal $C_i^-$ of cell $C_i$ are connected to the input of a DC to DC convertor 57, which generates, relative to the ground or reference voltage $V_{REF}^1$ of cell $C_i$ (which equals the voltage potential of the negative terminal $C_i^-$ of cell $C_i$) the voltages $V_{REF}^i \pm 5V$, which are used to power the microcontroller 31 and the transceivers 45 and 47.

Figure 4:
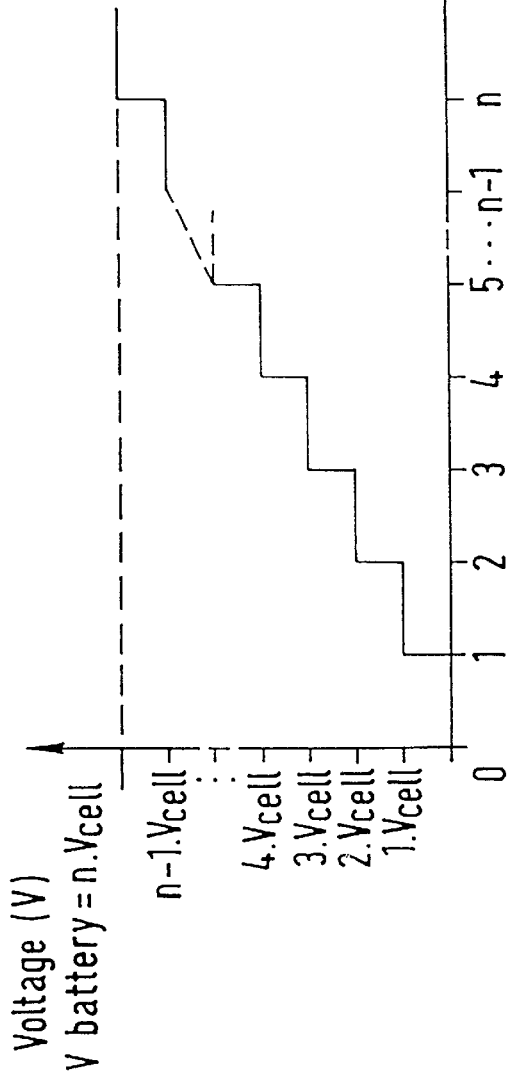
FIG. 4 is a plot showing the battery-cell voltage distribution.

FIG. 4 shows the voltage characteristic of the industrial battery showing each cell's terminal potential versus the cell's position in the series. As shown in FIG. 4, this voltage characteristic has a staircase shape, with each stair having a height equal to the voltage $V_{CELL}$ of the respective battery cell $C_i$. Each cell monitoring device $CM_i$ uses the fact that there is only a small difference between the reference voltages of adjacent cells and that therefore the transceivers 45 and 47 only have to increase or decrease the reference voltage of the received data by this voltage difference.

Figure 5A:
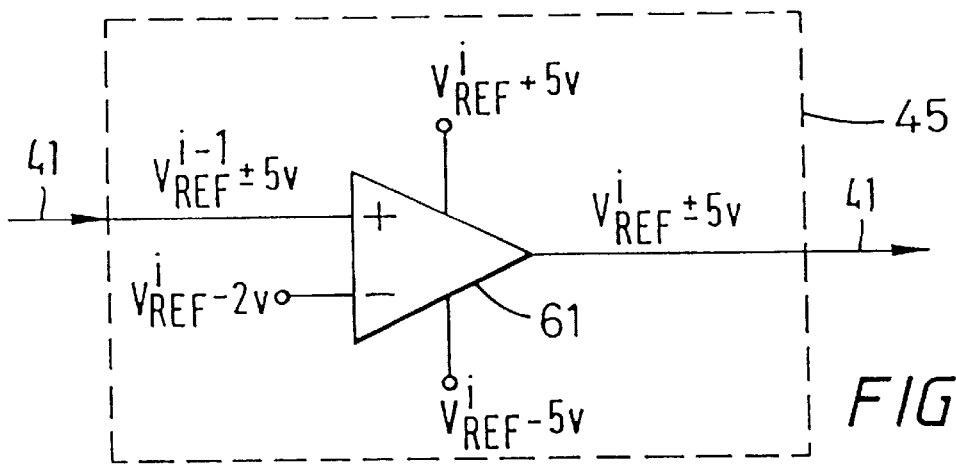
FIG. 5a is a circuit diagram of a first comparator forming part of the cell monitoring device shown in FIG. 3.
Figure 5B:
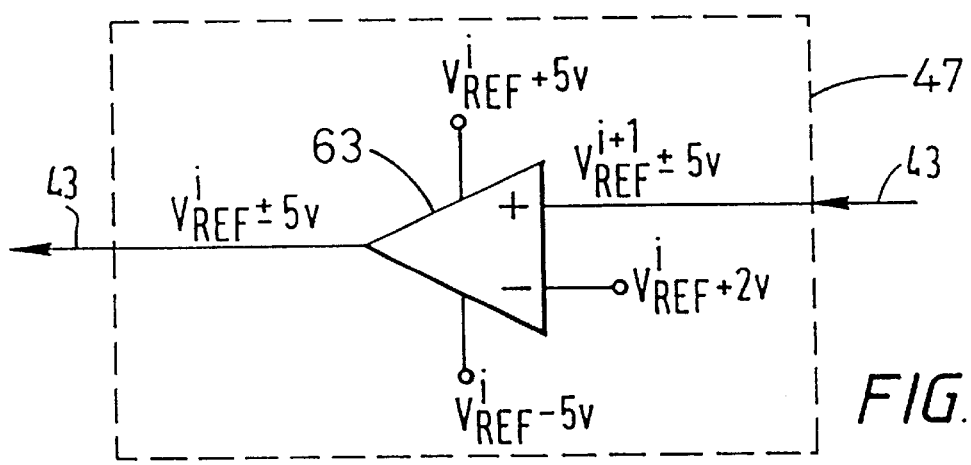
FIG. 5b is a circuit diagram of a second comparator forming part of the cell monitoring device shown in FIG. 3.

In this embodiment, the transceivers 45 and 47 comprise voltage comparators and the messages transmitted to and from the central battery monitoring system 3 are encoded within the transitions of a square wave signal. FIG. 5a is a circuit diagram of a voltage comparator 61 forming part of the transceiver 45 provided in the up-link 41 shown in FIG. 3. The limits of the comparator 61 are $V_{REF}^{i}+5V$ and $V_{REF}^{i}-5V$, which are generated by the DC to DC converter 57. FIG. 5b is a circuit diagram of a voltage comparator 63 forming part of the transceiver 47 provided in the down-link 43 shown in FIG. 3. As with comparator 61, the limits of comparator 63 are $V_{REF}^{i}+5V$ and $V_{REF}^{i}-5V$.

Figure 5C:
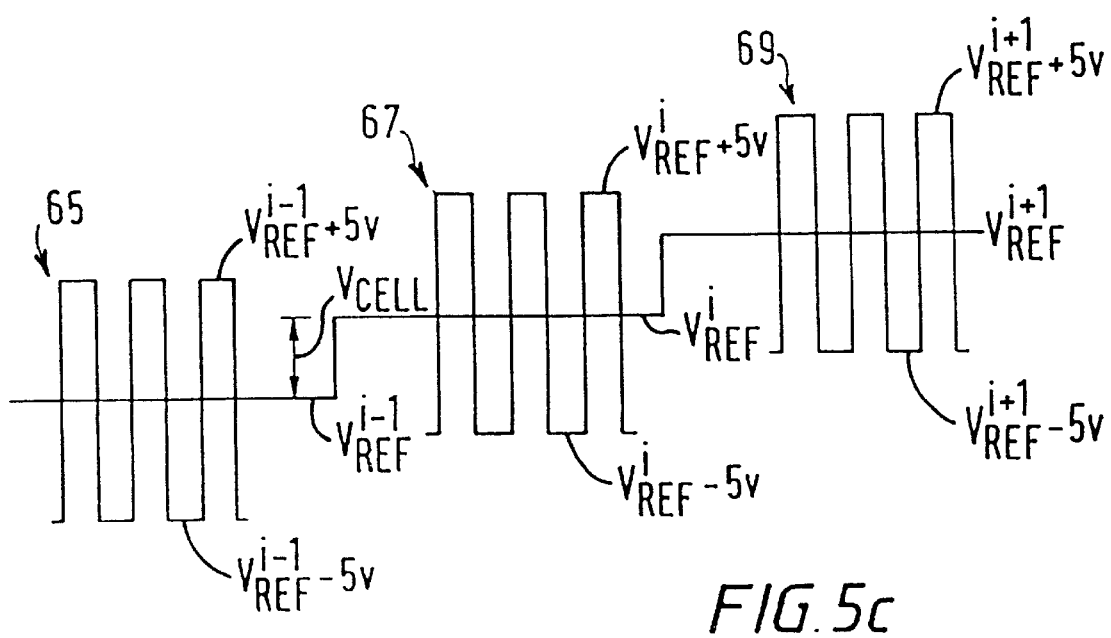
FIG. 5c is a schematic representation showing part of the battery-cell staircase voltage distribution and example data pulses which are applied to the input of the comparators shown in FIGS. 5a and 5b.

FIG. 5c shows part of the battery-cell voltage distribution shown in FIG. 4 and, superimposed thereon, data pulses for illustrating the way in which data is passed along the communication link 9. The left-hand side of FIG. 5c shows the ground or reference voltage $V_{REF}^{i-1}$ for cell $C_{i-1}$ and shows that data pulses 65 output by cell monitoring device $CM_{i-1}$, vary between $V_{REF}^{i-1}+5V$ and $V_{REF}^{i-1}-5V$. In this embodiment, when the data is originally transmitted from the central battery monitoring system 3, the data pulses 65 will be transmitted from cell $C_i^{-1}$ to cell $C_i$ and will be applied to the positive input of the comparator 61 on the up-link 41 of cell monitoring device $CM_i$ via switch 49. As shown in FIG. 5a, the received pulses are compared with $V_{REF}^{i}-2V$ (which is an approximation of the reference voltage $V_{REF}^{i-1}$ of the cell $C_i^{-1}$ which generated the received pulses 65, since the cells are lead acid battery cells which provide approximately 2 volts each) and the data pulses 67 output by comparator 61 will correspond with the received data pulses 65 but will vary between $V_{REF}^{i}+5V$ and $V_{REF}^{i}-5V$, as shown in the middle of FIG. 5c. Therefore, the DC level of the square wave pulses has been increased by passing it through the comparator 61.

The output data pulses 67 are transmitted to the next cell monitoring device $CM_{i+1}$ via switch 51 and communications link 9. The data pulses 67 output from comparator 61 are also input to the microcontroller 31 via connection 53, so that the microcontroller 31 can identify whether or not the communication from the central battery monitoring system 3 is directed to it. If the communication is directed to it, the microcontroller 31 processes the request, performs the necessary tests and transmits the appropriate data back to the central battery monitoring system 3.

When data pulses 69 are transmitted to cell monitoring device $CM_i$ from cell monitoring device $CM_{i+1}$ for transmitting back to the central battery monitoring system 3, the received data pulses 69, which vary between $V_{REF}^{i+1}+5V$ and $V_{REF}^{i+1}-5V$, are applied to the positive input of comparator 63 on the down-link 43 of cell monitoring device $CM_i$ via switch 51. As shown in FIG. 5b, the received pulses 69 are compared with $V_{REF}^{i}+2V$ (which is an approximation of the reference voltage $V_{REF}^{i+1}$ of the cell $C_{i+1}$ which generated the received pulses 69, since the cells are lead acid battery cells which provide approximately 2 volts each). As shown in FIG. 5c, this comparison results in a series of pulses 67 corresponding to the received pulses 65 but which vary between $V_{REF}^{i}\pm 5V$ which are transmitted to cell $C_{i-1}$ via switch 49. Therefore, the DC level of the square wave pulses has been reduced by passing it through the comparator 63.

Each of the cell monitoring devices $CM_i$ operate in a similar manner. However, it should be noted that the first cell monitoring device $CM_i$ has the same ground or reference voltage as the central battery monitoring system 3. Therefore, it is not necessary to use a transceiver 45 in the up-link 41 of the first cell monitoring device $CM_i$, although one is usually used in order to buffer the received signals and in order to standardise each of the cell monitoring devices $CM_i$. Similarly, the last cell monitoring device $CM_n$ will not receive data pulses from a subsequent cell monitoring device and therefore, does not need a transceiver 47 in its down-link. However, one is provided so that all the cell monitoring devices $CM_i$ are the same, and is used for buffering the data sent from microcontroller 31 of cell monitoring device $CM_n$ back to the central battery monitoring device 3.

The battery monitoring system described above has the following advantages:

(1) There is no need for voltage isolation between the cell monitoring devices $CM_i$ or between the first cell monitoring device $CM_1$ and the central battery monitoring system 3. Therefore, each cell monitoring device $CM_i$ will only consume a few milli-amps and only requires very inexpensive and readily available DC to DC converters for converting the battery cell voltage to the supply voltage needed by the microcontroller 31 and the transceivers 45 and 47.

(2) Since electrical isolation is not required between the cell monitoring devices $CM_i$, there is no longer a need for relatively expensive voltage isolated links between the cell monitoring devices. In the embodiment described, each cell monitoring device $CM_i$ is linked to its neighbours by a simple wire. The cost of the battery monitoring system is therefore low and system installation is simplified.

(3) Continuous monitoring of all the cells $C_i$ in battery 1 becomes economical and practical, and the user can be informed in real-time if one or more of the battery cells $C_i$ is under performing or is faulty.

(4) The internal resistance of each cell $C_i$ can be determined in real-time and without having to disconnect the cell from the battery, since the central battery monitoring system 3 is capable of measuring battery charging and discharging current (which is the same as the cell current) and can correlate it with individual cell voltages (determined by the cell monitoring devices) in order to calculate each cell's internal resistance.

(5) Each cell monitoring device $CM_i$ is able to measure the voltage drop on cell to cell interconnections and indicate a faulty interconnection condition, usually due to chemical deposits accumulating at the cell terminals with time or because of cell malfunction.

(6) Since each cell monitoring device $CM_i$ is able to measure the cell voltage and the cell temperature, it is possible to increase the probability of detecting a faulty cell. Therefore, the industrial battery need only be serviced when required.

(7) Since each cell monitoring device $CM_i$ can read the corresponding cell voltage, cell temperature etc. at the same time as the other cell monitoring devices, the data produced by each cell monitoring device is less likely to be corrupted by changes in load and/or changes in ambient temperature which occur with time, as compared with prior art systems which take readings from the individual cells one at a time.

A number of alternative embodiments will now be described, which operate in a similar manner to the first embodiment. Accordingly, the description of these alternative embodiments will be restricted to features which are different to those of the first embodiment.

Figure 6:
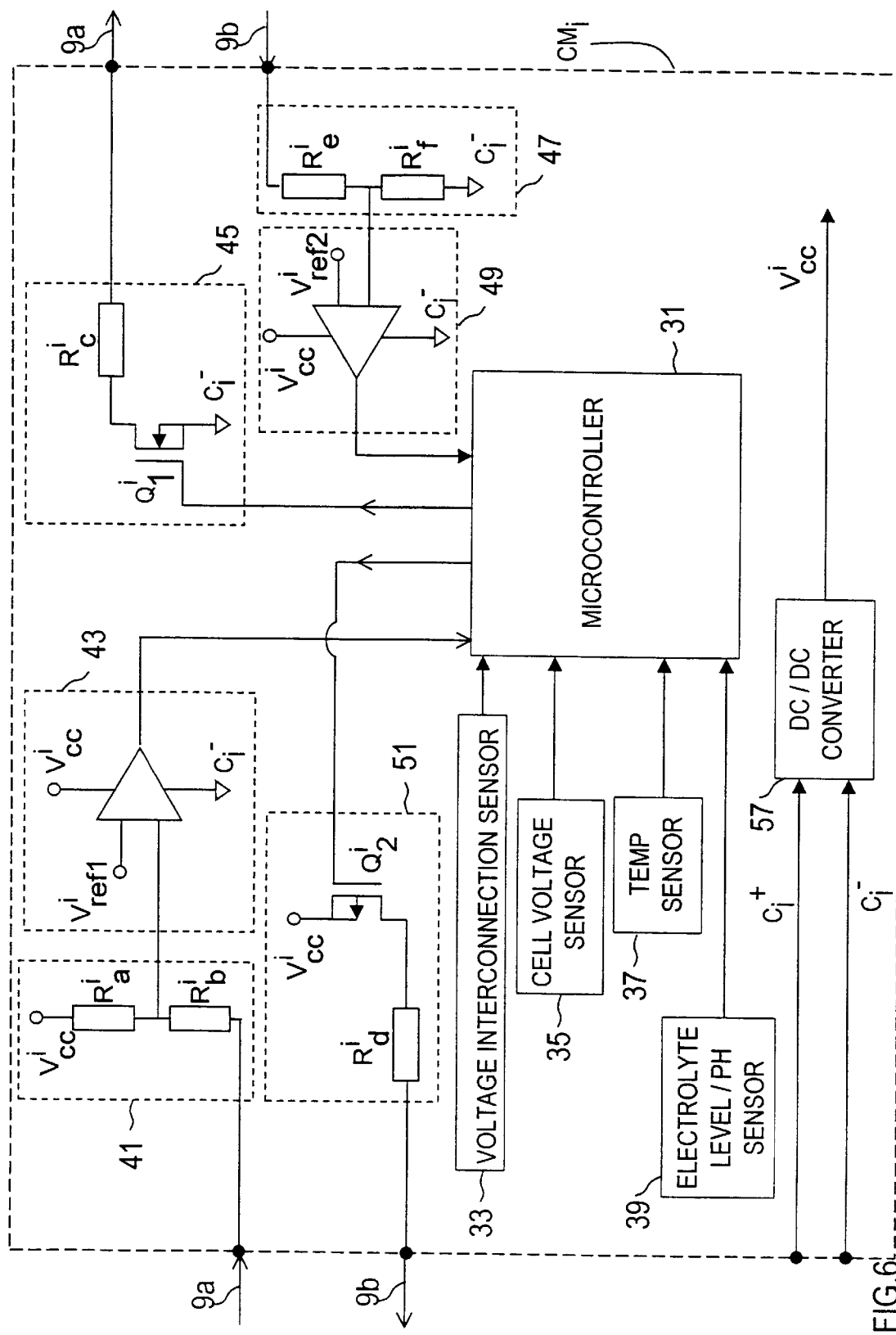
FIG. 6 is a schematic diagram of one of the cell monitoring devices according to a second embodiment of the present invention.

FIG. 6 is a schematic diagram showing, in more detail, one of the cell monitoring devices $CM_i$ shown in FIG. 1 according to a second embodiment of the present invention. As shown, cell monitoring device $CM_i$ comprises a microcontroller 31 for controlling the operation of the cell monitoring device $CM_i$ and for analysing sensor data received from voltage interconnection sensor 33, cell voltage sensor 35, temperature sensor 37 and electrolyte level/PH sensor 39, which all operate in the same manner as in the first embodiment.

In order to power the cell monitoring device $CM_i$, the positive terminal $C_i^+$ and the negative terminal $C_i^-$ of cell $C_i$ are connected to the input of a DC to DC convertor 57, which generates, relative to the ground of cell $C_i$ (which equals the voltage potential of the negative terminal $C_i^-$ of cell $C_i$) the voltage $V_{cc}^i$, which is used to power the microcontroller 31 and the other components in the device and which in this embodiment is $C_i^-$+3 Volts.

Since the cell monitoring devices are connected in series by the communication link 9, each cell monitoring device $CM_i$ is operable (i) to receive up-link communications originating from the central battery monitoring system 3 on wire 9a of the communication link 9 for reception by itself and/or for onward transmission to the next cell monitoring device $CM_{i+1}$; (ii) to receive down-link communications from cell monitoring device $CM_{i+1}$ on wire 9b of the communication link 9 for transmission back to the central battery monitoring system 3; and (iii) to transmit down-link communications generated by itself back to the central battery monitoring system 3 on wire 9b of the communication link 9.

As shown in FIG. 6, in this embodiment, the microcontroller 31 receives up-link communications originating from the central battery monitoring system 3 via wire 9a, potential divider 41 and comparator 43. The microcontroller 31 identifies whether or not the received message from the central battery monitoring system is for it or if it is for onward transmission to the next cell monitoring device $CM_{i+1}$. If the message is for the current cell monitoring device $CM_i$, then the microcontroller 31 decodes the message and takes the appropriate action. If the received message is for onward transmission, then the microcontroller 31 regenerates the message and outputs it to wire 9a via output block 45. In this embodiment, the messages transmitted are square-wave signals representing digital data. The signals are encoded for error correction purposes and the microcontroller 31 checks for errors in the received messages. Since the microcontroller 31 regenerates the messages for transmission to the next cell monitoring device $CM_{i+1}$, the timing between the transitions in the signal levels can be resynchronised, thereby reducing any errors caused by the transmission of the pulses along the communication link 9.

In a similar manner, down-link messages received from cell monitoring device $CM_{i+1}$ on wire 9b are passed via potential divider 47 and comparator 49 to the microcontroller 31. In this embodiment, all down-link communications are for transmission back to the central battery monitoring system 3. Therefore, the micro controller 31 checks for any errors in the received data and, if possible, corrects them. The microprocessor 31 then regenerates the message and outputs it to wire 9b via output block 51 for onward transmission back to the central battery monitoring system 3.

Figure 7:
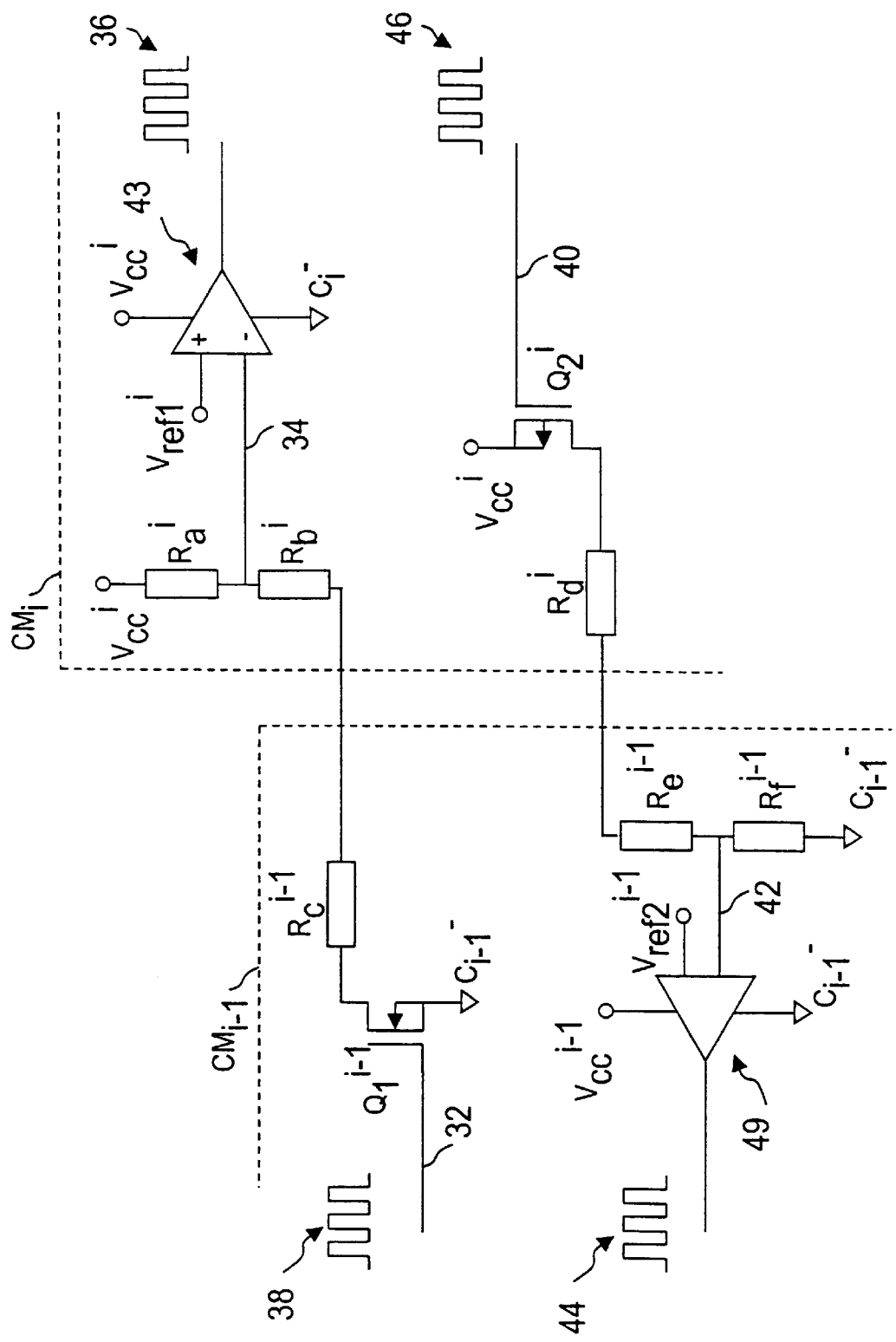
FIG. 7 schematically illustrates the way in which signals are passed between adjacent cell signalling devices in the second embodiment of the invention.

The way in which the messages are transmitted between the cell monitoring devices will now be described in more detail with reference to FIG. 7. Up-link messages originating from the central battery monitoring system 3 which are re-transmitted by the microcontroller 31 of cell monitoring device $CM_{i-1}$ are applied on line 32 to the gate electrode of the MOSFET $Q_1^{i-1}$. The source electrode of the MOSFET $Q_1^{i-1}$ is connected to the ground $C_{i-1}^-$ of cell monitoring device $CM_{i-1}$ and the drain electrode is connected, via resistors $R_a^i$, $R_b^i$ and $R_c^{i-1}$, to $V_{cc}^i$ output by the DC/DC converter 57 in cell monitoring device $CM_i$. In operation, when the microcontroller 31 in the cell monitoring device $CM_{i-1}$ outputs a voltage low (representing a binary 0) on line 32, the MOSFET $Q_1^{i-1}$ does not allow current to flow from the drain electrode to the source electrode and therefore effectively open circuits the connection between $V_{cc}^i$ and $C_{i-1}^-$. Therefore, when a voltage low is applied to the gate electrode of MOSFET $Q_1^{i-1}$, a voltage of approximately $V_{cc}^i$ is applied on line 34 to the comparator 43, where it is compared with reference voltage $V_{ref1}^i$. When the microprocessor 31 of cell monitoring device $CM_{i-1}$ outputs a voltage high (representing a binary 1) on line 32, the MOSFET $Q_1^{i-1}$ is switched on and current can flow from the drain electrode to the source electrode. Therefore, current will flow from $V_{cc}^i$ through resistors $R_a^i$, $R_b^i$ and $R_c^{i-1}$ through the MOSFET $Q_1^{i-1}$ to the ground $C_{i-1}^-$ of cell monitoring device $CM_{i-1}$. As a result, $V_{cc}^i$-X volts will be applied on line 34 to the comparator 43, where it is compared with the reference voltage $V_{ref1}^i$. The value of X depends upon the difference between $V_{cc}^i$ and $C_{i-1}^-$ and the values of the resistors $R_a^i$, $R_b^i$ and $R_c^{i-1}$. Provided the value of the reference voltage $V_{ref1}^i$ is between the voltage levels applied to the comparator 43 on line 34 when the MOSFET $Q_1^{i-1}$ is switched on and when it is switched off, the output of the comparator 43 will be a square-wave signal 36 varying between the ground potential $C_i^-$ and $V_{cc}^i$ of cell monitoring device $CM_i$ in synchronism with the variation of the square-wave signal 38 applied to the gate electrode of MOSFET $Q_1^{i-1}$ of cell monitoring device $CM_{i-1}$. Therefore, messages encoded within the variation of the signal applied to the MOSFET $Q_1^{i-1}$ in cell monitoring device $CM_{i-1}$ are transferred from cell monitoring device $CM_{i-1}$ to cell monitoring device $CM_i$.

In a similar manner, down-link messages output by the microcontroller 31 in cell monitoring device $CM_i$ for transmission back to the central battery monitoring system 3 are applied to the gate electrode of MOSFET $Q_2^i$ on line 40. The drain electrode of MOSFET $Q_2^i$ is raised to the potential $V_{cc}^i$ and the source is connected, via resistors $R_d^i$, $R_e^{i-1}$ and $R_f^{i-1}$, to the ground potential $C_{i-1}^-$ of cell monitoring device $CM_{i-1}$. In operation, when the microcontroller 31 in the cell monitoring device $CM_i$ outputs a voltage low on line 40, the MOSFET $Q_2^i$ does not allow current to flow from the drain electrode to the source electrode and therefore effectively open circuits the connection between $V_{cc}^i$ and $C_{i-1}^-$. Therefore, when a voltage low is applied to the gate electrode of MOSFET $Q_2^i$, approximately zero volts is applied on line 42 to the comparator 49, where it is compared with reference voltage $V_{ref2}^{i-1}$ When the microcontroller 31 of cell monitoring device $CM_i$ outputs a voltage high on line 40, the MOSFET $Q_2^i$ is switched on and current flows from $V_{cc}^i$ through resistors $R_d^i$, $R_e^{i-1}$ and $R_f^{i-1}$ to the ground $C_{i-1}^-$ of the cell monitoring device $CM_{i-1}$. As a result, $V_{cc}^i$-Y volts will be applied on line 42 to the comparator 49, where it is compared with the reference voltage $V_{ref2}^{i-1}$. The value of Y depends upon the difference between $V_{cc}^i$ and $C_{i-1}^-$ and the values of resistors $R_d^i$, $R_e^{i-1}$ and $R_f^{i-1}$. Again, provided the value of the reference voltage $V_{ref2}{}^{ii-1}$ is between the voltage levels applied to the comparator 49 on line 42 when the MOSFET $Q_2{}^i$ is switched on and when it is switched off, the output of the comparator 49 will be a square-wave signal 44 varying between the ground potential $C_{i-1}{}^-$ and $V_{cc}{}^{i-1}$ of cell monitoring device $CM_{i-1}$ in synchronism with the variation of the signal 46 applied to the gate electrode of MOSFET $Q_2{}^i$ of cell monitoring device $CM_i$. Therefore, messages encoded within the variation of the signal applied to MOSFET $Q_2{}^i$ are transferred from cell monitoring device $CM_i$ to cell monitoring device $CM_{i-1}$.

The values of the resistors $R_a{}^i$ to $R_f{}^i$ in each cell monitoring device $CM_i$ are chosen in order (i) to buffer the input and output terminals of the cell monitoring devices $CM_i$; (ii) to reduce power consumption of the cell monitoring devices $CM_i$; and (iii) to provide the necessary voltage division with respect to the difference in voltage between adjacent cell monitoring devices.

As those skilled in the art will appreciate, the above technique for transferring up-link and down-link data between cell monitoring devices $CM_{i-1}$ and $CM_i$ will only work provided the difference between $V_{cc}{}^i$ and $C_{i-1}{}^-$ does not exceed the operating range of the MOSFET switches $Q_1{}^{i-1}$ and $Q_2{}^i$. In this embodiment, each battery cell $C_i$ is provided with a cell monitoring device $CM_i$, the difference in operating potentials of adjacent cell monitoring devices is approximately two volts and $V_{cc}{}^i$ is three volts more than the ground potential of the cell monitoring device. Therefore, in this embodiment, the difference between $V_{cc}{}^i$ and $C_{i-1}{}^-$ is approximately five volts. MOSFET transistors Q which can operate with such a loading are readily available. Indeed, there are some commercially available MOSFETs which can operate with a loading of up to sixty volts. Therefore, this technique of transmitting data between adjacent cell monitoring devices can be used in most practical situations, even in an embodiment where, for example, one cell monitoring device is provided for every tenth battery cell $C_i$.

Each of the cell monitoring devices $CM_i$ operate in a similar manner. However, it should be noted, that in this embodiment, the first cell monitoring device $CM_1$ has the same ground or reference voltage as the central battery monitoring system 3. Therefore, in this embodiment, it is not necessary to use the potential divider 41 and the comparator 43 of the up-link nor the output block 51 in the down-link of the first cell monitoring device $CM_1$, although these are usually provided in order to standardise each of the cell monitoring devices $CM_i$. Similarly, the last cell monitoring device $CM_n$ will not transmit data to nor receive data from a subsequent cell monitoring device. Therefore, cell monitoring device $CM_n$ does not need the output block 45 in the up-link nor the potential divider 47 and the comparator 49 in the down-link. However, these are usually provided so that all the cell monitoring devices $CM_i$ are the same.

Figure 8:
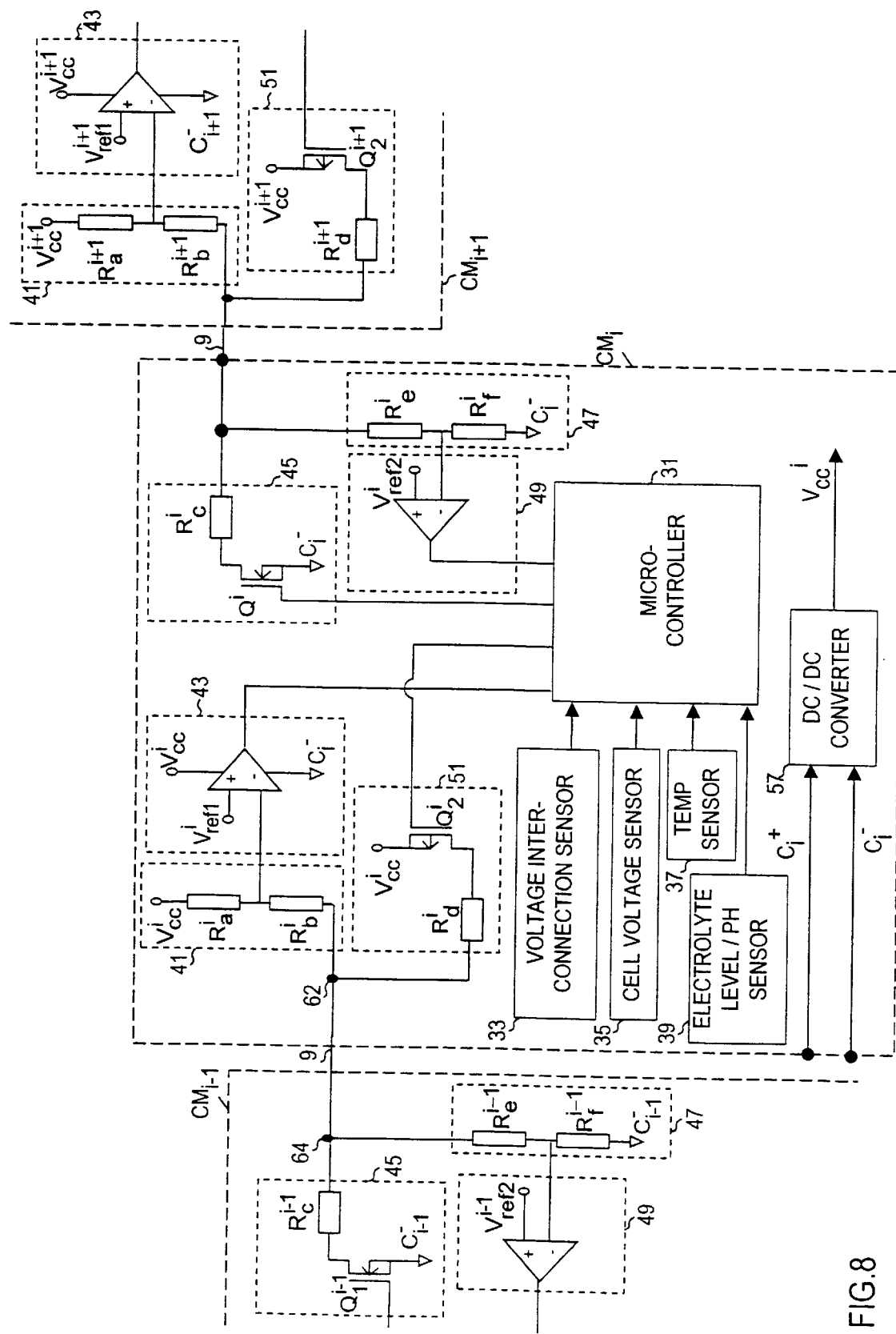
FIG. 8 schematically illustrates the form of a cell monitoring device according to a third embodiment and the way in which it is connected to neighbouring cell monitoring devices.

As those skilled in the art will appreciate, in the above embodiment, solid state switches were used to, effectively, shift the DC level of the received signals for onward transmission. FIG. 8 illustrates a further embodiment which uses analogue switches to transmit messages uplink as well as downlink between adjacent cell monitoring devices $CM_i$, via a single communication wire 9 which connects the cell monitoring devices in series. As shown in FIG. 8, each cell monitoring device $CM_i$ has the same potential dividers 41 and 49, comparators 43 and 47, and output blocks 45 and 51 as in the second embodiment. The difference between this embodiment and the second embodiment is that the uplink and the downlink between adjacent cell monitoring devices share a common communication wire 9. This is achieved by connecting, at connection 62, the output of block 51 in cell monitoring device $CM_i$ to the connection between potential divider 41 in cell monitoring device $CM_i$ and the output block 45 in cell monitoring device $CM_{i-1}$ and by connecting, at connection 64, the potential divider 49 in cell monitoring device $CM_{i-1}$ to the connection between potential divider 41 in cell monitoring device $CM_i$ and the output block 45 in cell monitoring device $CM_{i-1}$.

Since both the uplink and the downlink connection between adjacent cell monitoring devices is via the same wire 9, communications between cell monitoring devices can be in one direction only at any given time. To achieve this, during a downlink communication, MOSFET $Q_1{}^{i-1}$ is switched off so that messages transmitted by switching the state of MOSFET $Q_2{}^i$ pass via the potential divider 49 and the comparator 47 into the microcontroller (not shown) in cell monitoring device $CM_{i-1}$. Similarly, for uplink communications from, for example, cell monitoring device $CM_i$ to cell monitoring device $CM_{i+1}$, the MOSFET $Q_2{}^{i+1}$ is switched off so that the output block 51 has a high impedance and does not affect the operation of the potential divider 41. Further, as those skilled in the art will appreciate, in order for the potential dividers and output blocks to operate in the same way as in the second embodiment, the resistances of resistors $R_a$, $R_b$, $R_e$ and $R_f$ must be relatively large compared to the resistances of resistors $R_c$ and $R_d$. In this embodiment, with 2 volt battery cell voltages, $R_a=R_b=R_e=R_f=10K$ ohms, $R_d=R_c=2K$ ohms, $V_{ref1}{}^i=V_{ref2}{}^i=V_{cc}{}^i/2$ and $V_{cc}{}^i=C_i{}^-+5V$. As those skilled in the art will appreciate, the cell monitoring device of this embodiment can easily be adapted to operate with any battery cell voltage, the only changes that are required are the resistor values, the reference voltage values and the maximum allowable drain to source voltage of the MOSFETs.

Figure 9:
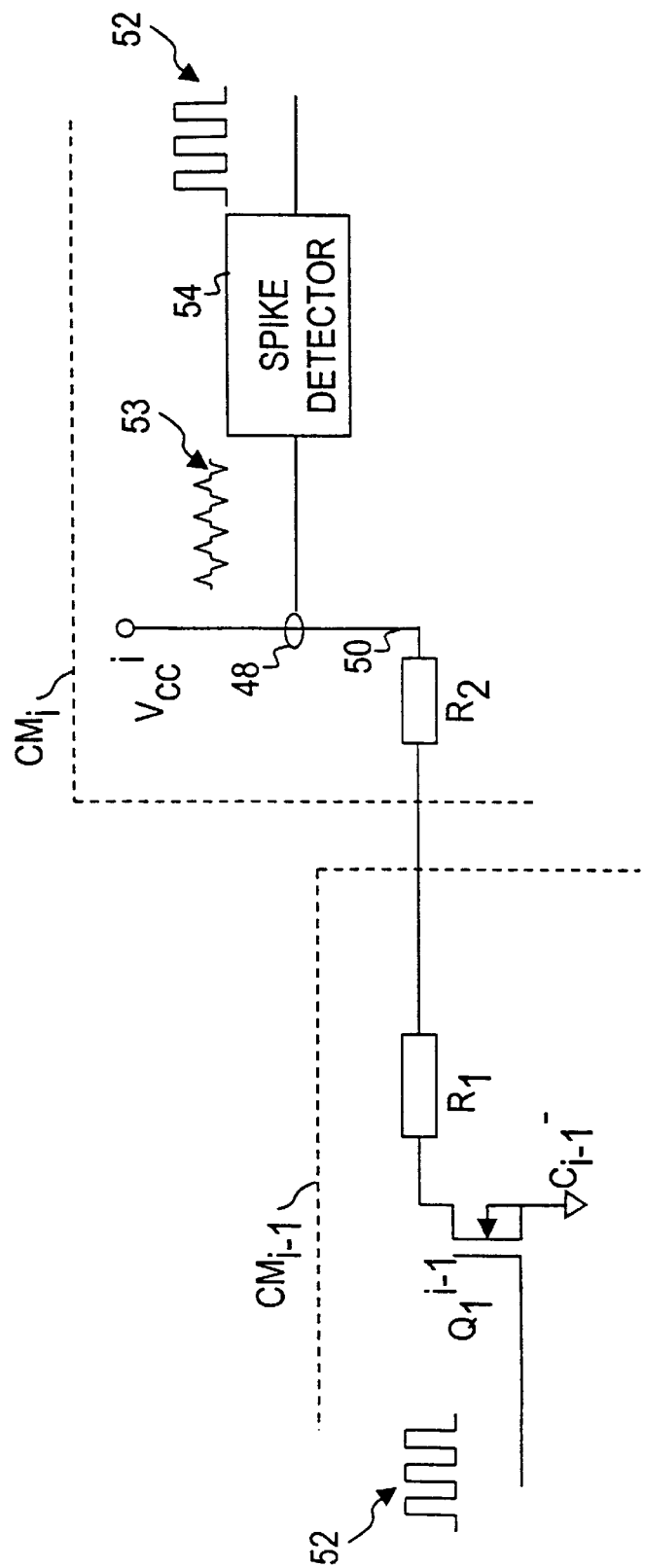
FIG. 9 schematically illustrates an alternative way in which signals can be transmitted between adjacent cell signalling devices.

As those skilled in the art will appreciate, in the above embodiments, data was transmitted between adjacent cell monitoring devices by varying the output impedance of an output block in the cell monitoring device which is to transmit the message and by detecting this variation in the cell monitoring device which is to receive the message. For example, when up-link message data is to be transmitted from cell monitoring device $CM_{i-1}$ to cell monitoring device $CM_i$, the impedance of output block 45 in cell monitoring device $CM_{i-1}$ is varied in dependence upon the data to be transmitted—when a voltage low is to be transmitted, the impedance of output block 45 is made to be very high, whereas when a voltage high is to be transmitted, the impedance of output block 45 is made to be relatively low. This variation of the impedance of output block 45 is detected by the potential divider 41 and the comparator 43 in the cell monitoring device $CM_i$ which is to receive the transmitted up-link message. As those skilled in the art will appreciate, there are various ways of varying an output impedance of a cell monitoring device in dependence upon the data to be transmitted and various ways of detecting that variation in the adjacent cell monitoring device. FIG. 9 shows one of these alternative embodiments.

In the embodiment shown in FIG. 9, the output impedance of cell monitoring device $CM_{i-1}$ is varied in the same way as it was varied in the second embodiment but this variation is detected in cell monitoring device $CM_1$ in a different manner. In particular, in this embodiment, a current detector 48 is used to detect the changes in current flowing between the $V_{cc}{}^i$ terminal in cell monitoring device $CM_i$ to the ground potential $C_{i-1}{}^-$ in cell monitoring device $CM_{i-1}$. In operation, when a voltage low is applied to the gate electrode of MOSFET $Q_1{}^{i-1}$, the MOSFET is open and no current flows down line 50. However, when a voltage high is applied to the gate electrode of MOSFET $Q_1^{i-1}$, the MOSFET opens and current is drawn down line 50. This change in current is detected by the current sensor 48. More specifically, each time there is a transition from a voltage high to a voltage low (or vice versa) applied to the gate electrode of MOSFET $Q_1^{i-1}$, a voltage spike is induced in the current detector 48. As illustrated in FIG. 9, in response to up-link message data 52 being applied to the MOSFET $Q_1^{i-1}$, a train of voltage spikes 53 are induced in the current detector 48 and passed to a spike detector 54 which regenerates and outputs the up-link message data 52 for transmission to the microcontroller (not shown). The resistors $R_1$ and $R_2$ are provided in order to reduce the power consumed by each of the cell monitoring devices $CM_i$ and in order to buffer the input and output of the respective cell monitoring devices.

In the last three embodiments, MOSFET switches were used as a device whose impedance can be varied in dependence upon the message data to be transmitted. As those skilled in the art will appreciate, these MOSFETs can be replaced by any electronic switches (solid-state relays, electromechanical relays, J-FETs, transistors etc.) and, in embodiments where the up-link and the down-link messages are received and re-transmitted by a microcontroller, can be omitted altogether. This is because the output impedance of the output pin of the microcontroller varies in dependence upon whether it is outputting a voltage high or a voltage low. Therefore, for example, the output pin from the microcontroller in cell monitoring device $CM_{i-1}$ could be directly connected to the potential divider 41 in cell monitoring device $CM_i$. However, such an embodiment is not preferred, because the microcontroller can be damaged by the voltage applied to the output pin from the adjacent cell monitoring device.

Figure 10:
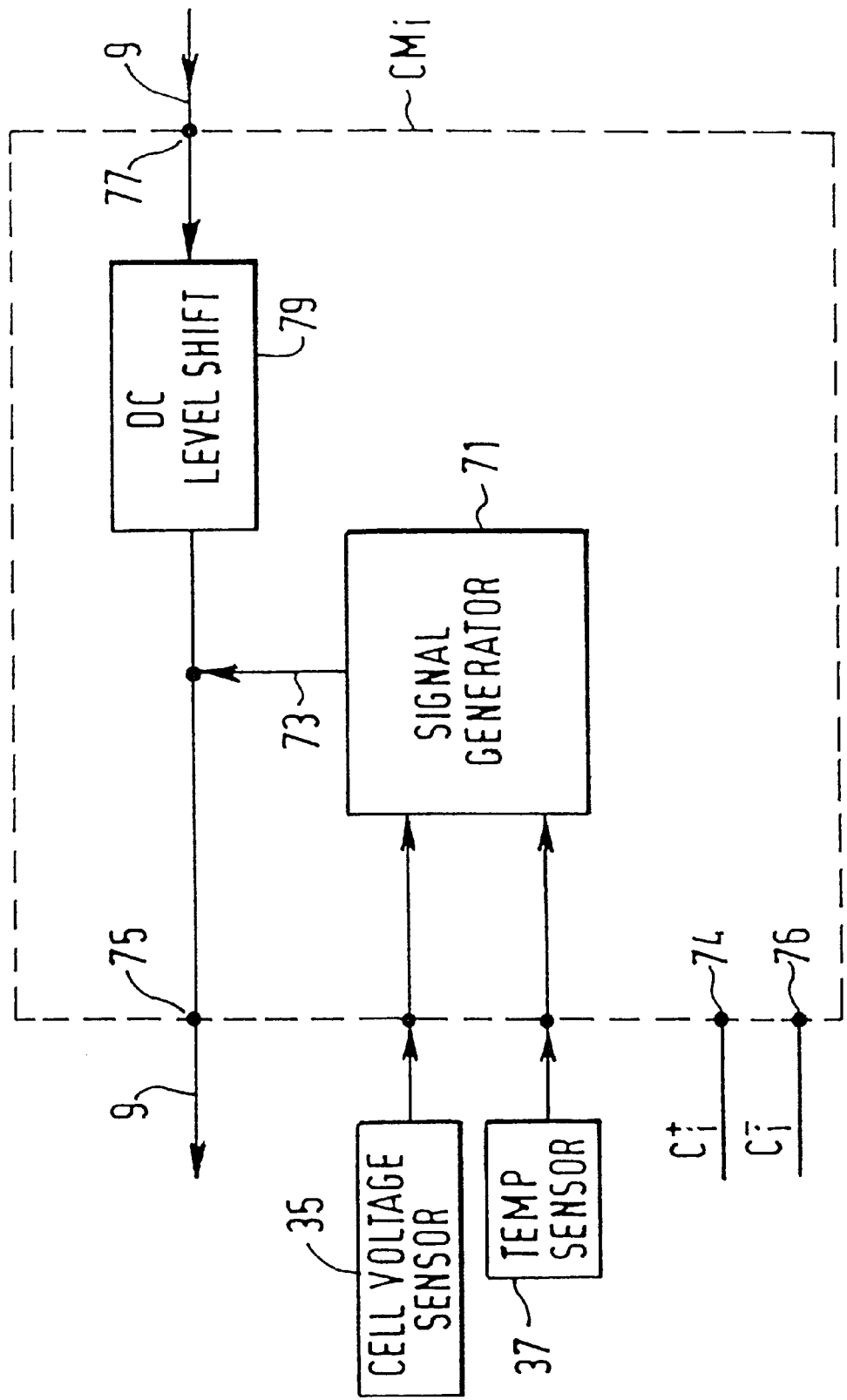
FIG. 10 is a schematic diagram of a battery cell monitoring device for use in a battery monitoring system according to a second embodiment of the present invention.

In the above embodiments, each cell monitoring device $CM_i$ has a microcontroller 31 for receiving messages from the central battery monitoring system 3, for analysing data from various sensors and for sending data back to the central battery monitoring system 3 via the communication link 9. FIG. 10 schematically shows an alternative cell monitoring device $CM_i$ of an alternative embodiment which does not use a microcontroller 31.

In particular, as shown in FIG. 10, each cell monitoring device $CM_i$ comprises a signal generator 71 which receives sensor signals from the cell voltage sensor 35 and the temperature sensor 37 and outputs, on line 73, a signal which varies in dependence upon the received sensor signals. The signal generator 71 may comprise a voltage controlled oscillator which outputs an alternating signal whose frequency varies in dependence upon an input voltage from, for example, the cell voltage sensor 35. The signal output from the signal generator 71 is applied to an output terminal 75 for transmission to the central battery monitoring system 3, via the communication link 9. In this embodiment, each cell monitoring device $CM_i$ only transmits signals back to the central battery monitoring system 3, they can not receive messages from the central battery monitoring system. Therefore, only a down-link is required to receive signals at input terminal 77, transmitted from cell monitoring device $CM_{i+1}$.

As in the first embodiment, each cell monitoring device $CM_i$ is powered by the cell $C_i$ which it is monitoring. This is illustrated in FIG. 6 by the connections $C_i^+$ and $C_i^-$ which are connected to input terminals 74 and 76 respectively. Since the communication link 9 connects each of the cell monitoring devices $CM_i$ in series in a daisy chain configuration, cell monitoring device $CM_i$ will receive signals, at input terminal 77, from cell monitoring device $CM_{i+1}$. The received signals are applied to a DC level shift circuit 79 which reduces the DC level of the received signals and supplies them to the output terminal 75 for transmission to the next cell monitoring device $CM_{i-1}$ in the communication link 9.

Figure 11:
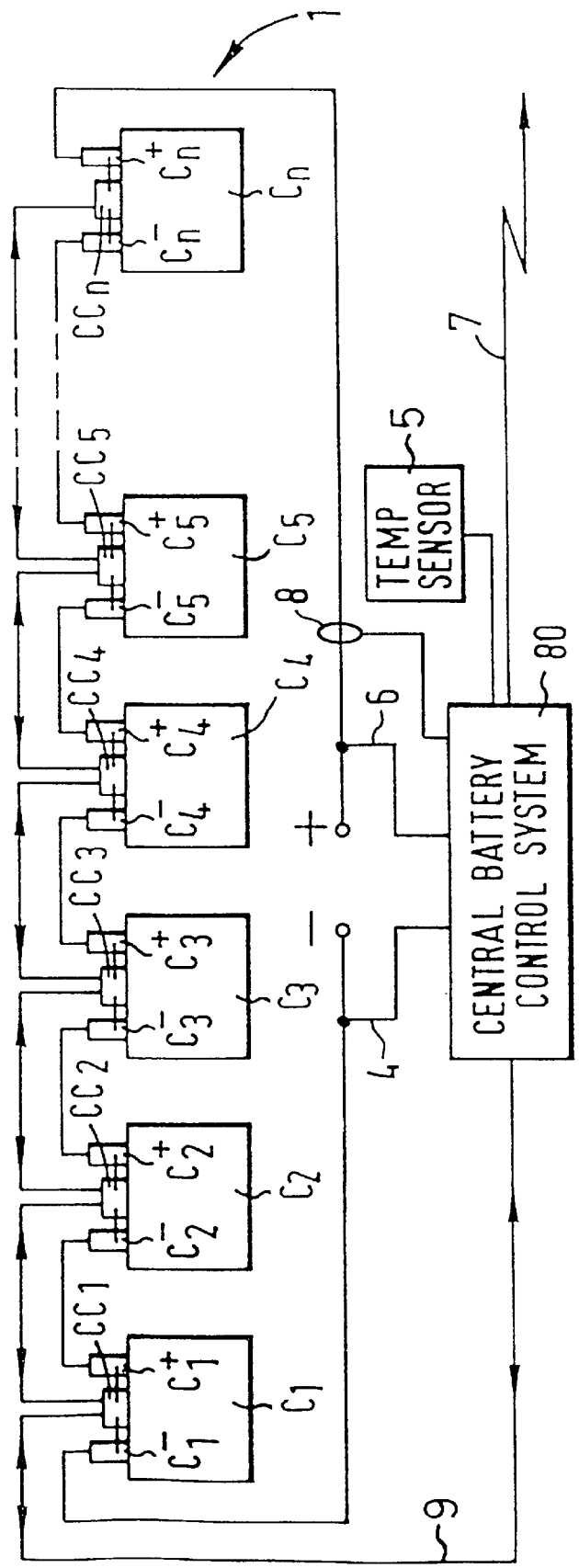
FIG. 11 schematically shows a battery comprising a number of battery cells connected in series, a central battery control system for controlling the battery as a whole and individual battery cell controllers for controlling the cells of the battery.

In the above embodiments, the system described was a battery monitoring system. FIG. 11 schematically shows an embodiment which is a control system for controlling the cells of an industrial battery. As shown, the control system has a similar architecture to the battery monitoring system shown in FIG. 1, except that the central battery monitoring system 3 is now a central battery control system 80 and the cell monitoring devices $CM_i$ are now battery cell control devices $CC_i$. As in the monitoring system of FIG. 1, the central battery control system 80 communicates with each of the cell controlling devices $CC_i$ via the communication link 9.

Figure 12:
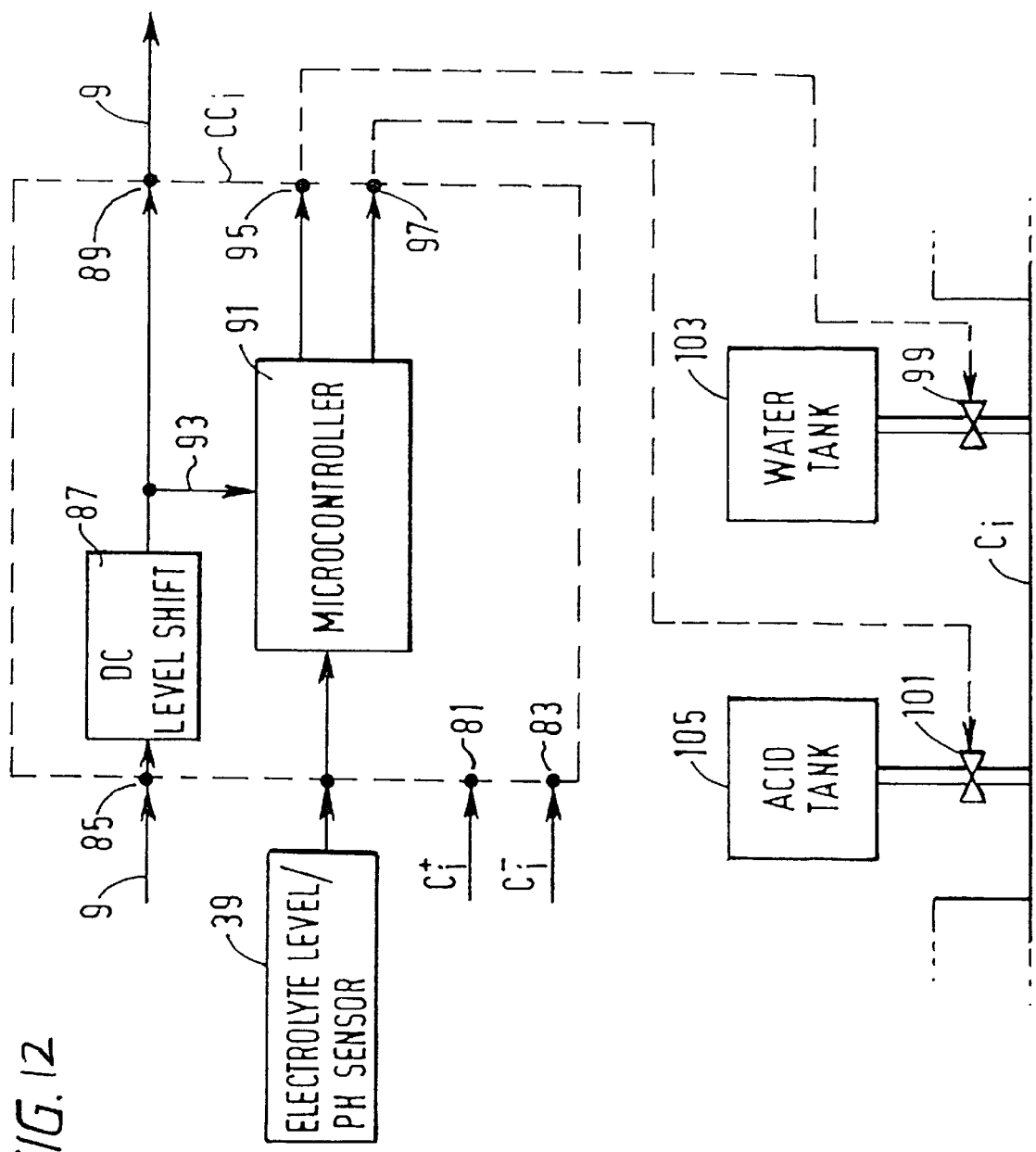
FIG. 12 is a schematic diagram of one of the battery cell control devices shown in FIG. 11.

FIG. 12 schematically shows an example of one of the battery cell control devices $CC_i$ shown in FIG. 11. In this example, each cell controlling device $CC_i$ is used to control the topping up of acid and water in the respective battery cell $C_i$, in response to an appropriate control signal received from the central battery control system 80. As in the above embodiments, each cell control device $CC_i$ is powered by the cell which it is to control, as represented by inputs $C_i^+$ and $C_i^-$ applied to input power terminals 81 and 85 respectively. In this embodiment, each cell controlling device $CC_i$ is arranged to receive messages from the central battery controlling system (not shown), but not to transmit messages back. Accordingly, signals received at the input terminal 85 from cell controller $CC_{i-1}$ are applied to DC level shift circuit 87, which increases the DC level of the received signals and outputs them to output terminal 89 for transmission to the next cell controlling device $CC_{i+1}$. The microcontroller 91 monitors the received signals via connection 93 and outputs appropriate control signals to output terminals 95 and 97 when the received signals are directed to it. The control signals output to terminals 95 and 97 are used to control the position of valves 99 and 101 respectively, so as to control the amount of water and acid to be added to the battery cell $C_i$ from the water tank 103 and the acid tank 105. The microcontroller 91 determines the amount of water and acid to add with reference to the sensor signals received from the electrolyte level/PH sensor 39.

Figure 13:
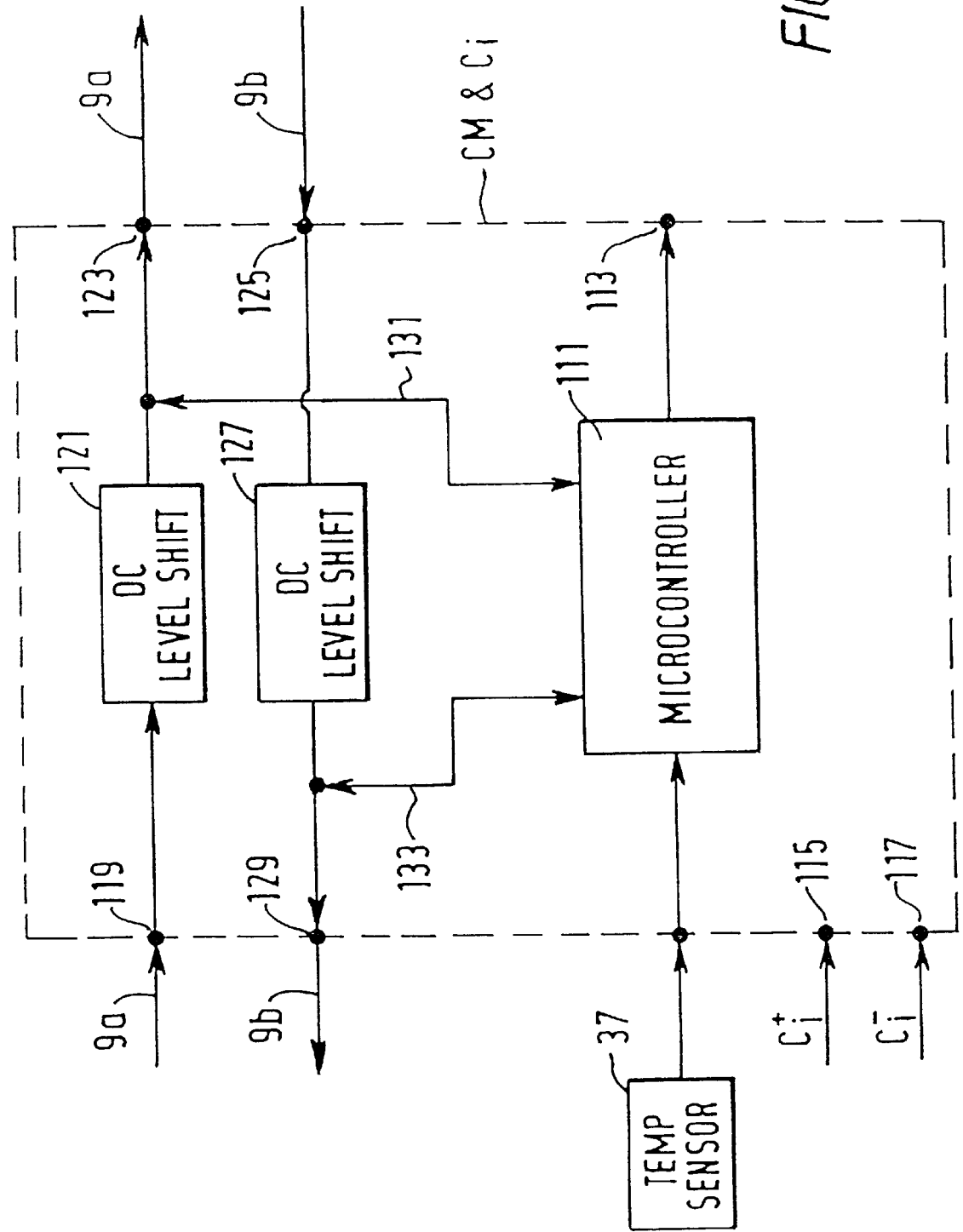
FIG. 13 is a schematic diagram of a battery cell monitoring and control device for use in a battery monitoring and control system embodying the present invention.

In the above embodiments, a central battery monitoring system or a central battery control system was provided which monitored or controlled the system as a whole. FIG. 13 schematically shows a cell monitoring and control device $CM\&C_i$ which can be used in a combined battery control and monitoring system in which there is no central battery monitoring and control system and in which each cell monitoring and control device $CM\&C_i$ communicates directly with the other cell monitoring and control devices. As in the other embodiments, each cell monitoring and control device $CM\&C_i$ is powered by the cell which it is monitoring and controlling, as represented by inputs $C_i^+$ and $C_i^-$ applied to input power terminals 115 and 117 respectively.

As shown in FIG. 13, each cell monitoring and control device $CM\&C_i$ comprises a microcontroller 111 which receives sensor data from temperature sensor 37 and which outputs control data to output terminal 113 for controlling, for example, a liquid crystal display (not shown) mounted on the respective cell $C_i$.

In this embodiment, the communication link comprises two wires 9a and 9b and therefore, switches 49 and 51 are not required to connect the up-link and the down-link to the communication link 9. Wire 9a is used for passing communications up the series communication link 9 from cell monitoring and control device CM&C$_i$ to cell monitoring and control device CM&C$_{i+1}$ and wire 9b is used for transmitting signals down the series communication link 9 from cell monitoring and control device CM&C$_i$ to cell monitoring and control device CM&C$_{i-1}$. Accordingly, the signals received by cell monitoring and control device CM&C$_i$ at input terminal 119 are applied to DC level shift circuit 121 which increases the DC level of the received signals and outputs them to output terminal 123 for transmission to cell monitoring and control device CM&C$_{i+1}$. Similarly, signals received at input terminal 125 are applied to DC level shift circuit 127 which decreases the DC level of the received signals and outputs them to output terminal 129 for transmission to cell monitoring and control device CM&C$_{i-1}$. As shown, microcontroller 111 can receive data from and transmit data to both the up-link 9a and the down-link 9b via connections 131 and 133 respectively.

Various modifications which can be made to the above described embodiments will now be described.

In the first embodiment, the transceivers 45 and 47 used in the up-link and the down-link within each cell monitoring device CM$_i$ comprises a voltage comparator. Other types of transceivers could be used. For example, voltage to current and current to voltage comparators could be used. In such an embodiment, the voltage to current comparators and the current to voltage comparators would be arranged alternatively along the communication link 9 so that a voltage to current comparator is connected to the input of a current to voltage comparator, and vice-versa.

In the first embodiment the data transmitted between cells and between the first cell and the central battery monitoring systems varies between $V_{REF}{}^i \pm 5V$. The value of 5 volts was chosen for convenience since the normal operating voltage for the microcontroller 31 is 5 volts above the ground voltage for that cell. Theoretically, where the data transmitted between cells is given by $V_{REF}{}^i \pm X$ volts, X must be greater than half the cell voltage $V_{CELL}$ in order for the comparator to be able to regenerate the received data pulses at the increased or decreased potential. Practically, since the battery cells and the comparators are not ideal, X should be at least two and a half times the cell voltage $V_{CELL}$.

In the first embodiment, a cell monitoring device was used to monitor each cell of the battery. In a cheaper implementation, each cell monitoring device CM$_i$ could be used to monitor two or three series connected battery cells C$_i$. However, in such an embodiment, where the data transmitted between cell monitoring device is given by $V_{REF}{}^i \pm X$ volts, X should be at least two and a half times the difference in the reference potentials between adjacent cell monitoring devices.

In the first embodiment, the received data pulses are compared with an approximation of the ground or reference voltage of the cell which sent the data pulses. Alternatively, the received data pulses could simply be compared with the reference voltage of the cell monitoring device which receives the data pulses.

Figure 14:
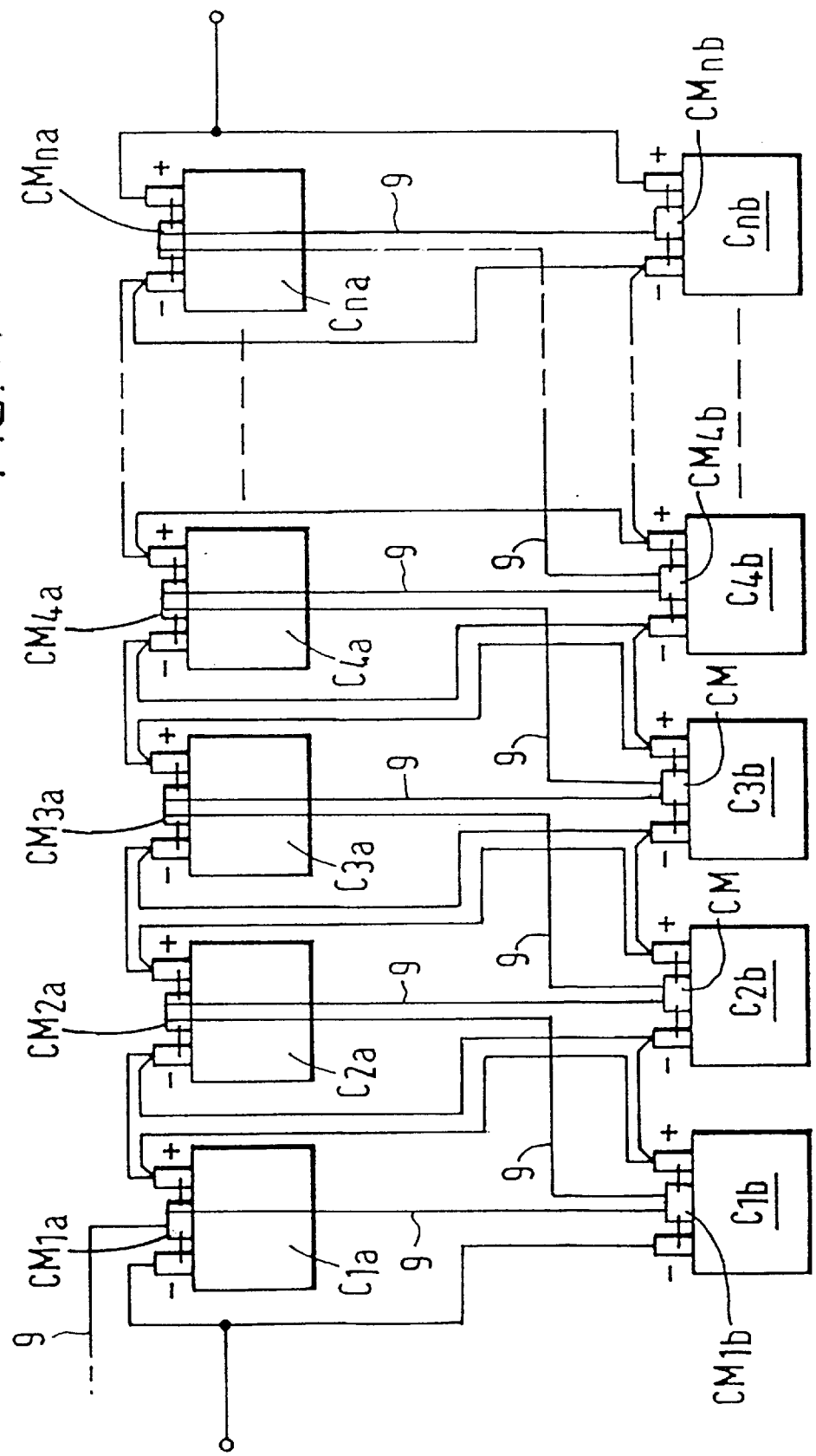
FIG. 14 is a schematic representation of an industrial battery in which the cells of the battery are connected in a series-parallel configuration.

In the embodiments described, the cells are connected in series. It is possible to connect the battery cells C$_i$ in a series-parallel or ladder configuration. FIG. 14 shows such an interconnection of battery cells, in which cell C$_{ia}$ is connected in parallel with cell C$_{ib}$ and the parallel combinations C$_{ia}$ and C$_{ib}$ are connected in series for i=1 to n. In the configuration shown in FIG. 14, a single cell monitoring device CM$_i$ is provided for monitoring each of the battery cells and the communication link 9 connects CM$_{ia}$ to CM$_{ib}$ and CM$_{ib}$ to CM$_{i+1a}$ etc. Alternatively, a single cell monitoring device could be used to monitor each parallel combination of battery cells C$_{ia}$ and C$_{ib}$. Additionally, more than two battery cells can be connected in parallel.

In the above embodiments, the central battery monitoring and/or control system was provided at the zero volt reference voltage end of the communication link 9. Alternatively, the central battery monitoring and/or control system could be connected at the high reference voltage end of the communication link 9. Alternatively still, the central battery monitoring and/or control system could be connected at both ends, thereby forming a circular communications path in which messages which are transmitted to and received from the battery monitoring/controlling system are passed in one direction through the cell monitoring/controlling devices. Therefore, each cell monitoring/controlling device only needs either an up-link or a down-link for increasing or decreasing the DC level of the received signals, depending on whether the messages are transmitted up or down the communication staircase.

In the above described embodiments, the communication link 9 comprised either one or two wires. As those skilled in the art will appreciate, the communication link 9 may comprise any number of wires along which data can be transmitted in parallel.

In the above embodiments, a separate central battery monitoring system or a central battery control system was provided. In an alternative embodiment, a combined battery monitoring and control system could be used to both monitor and control the battery.

Figure 15:
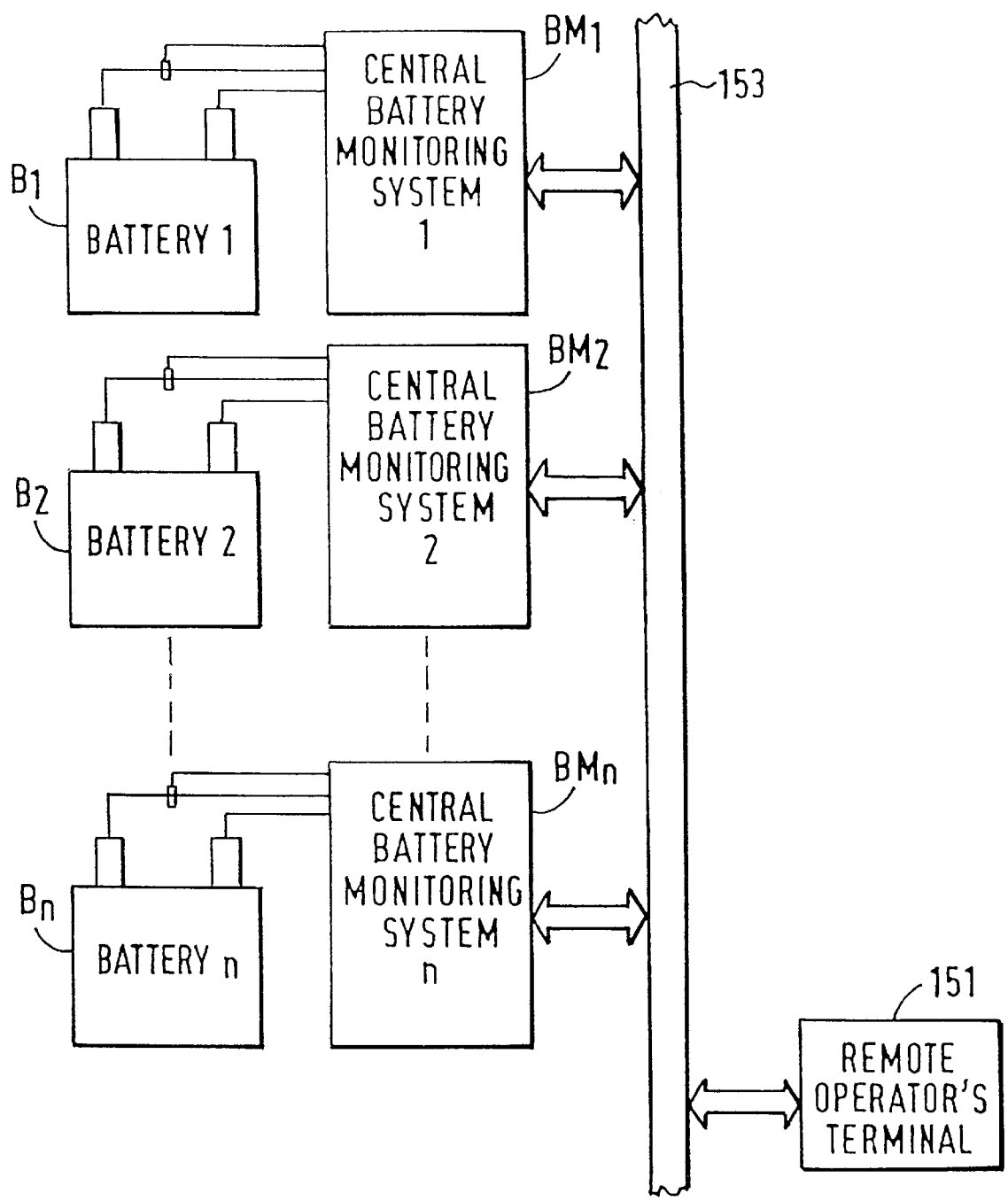
FIG. 15 is a schematic diagram of a system for monitoring a plurality of industrial batteries.

In the above described embodiments, a single battery comprising a plurality of battery cells, is monitored and/or controlled by a central battery monitoring and/or controlling system. FIG. 15 shows an alternative embodiment where a plurality of batteries B$_i$ are provided, and wherein each battery B$_i$ is monitored by its own central battery monitoring system BM$_i$ which communicates with a remote operator's terminal 151 via a data bus 153. The data bus 153 may be a proprietary data link or can be the public telephone exchange. In operation, each of the central battery monitoring systems BM$_i$ monitors the respective battery B$_i$ and reports its status back to the remote operator's terminal 151, where the condition of each of the batteries is monitored by a human operator. A similar system could also be provided for controlling or for monitoring and controlling a plurality of batteries.

In the first embodiment, a cell monitoring device was used to monitor each cell of the battery. In an alternative less expensive implementation, each cell monitoring device CM$_i$ could be used to monitor two or more series connected battery cells C$_i$.

In the above embodiments which employ MOSFET switches, the cell signalling devices were connected in series in a daisy-chain configuration, with the position of each cell signalling device in the series communication link corresponding with the position of the cell or cells which are to power the cell signalling device in the series connection of battery cells. This is not essential. The cell signalling devices can be connected in any arbitrary series configuration relative to the series connection of battery cells. This is because the MOSFET switches Q$_1$ and Q$_2$ operate in the same manner irrespective of the voltage loading applied across their drain and source electrodes. However, in this case, the values of the resistors R$_a$ to R$_f$ in each cell monitoring/control device will be different and will be chosen so as to provide the necessary voltage division having regard to the difference in voltage between adjacent cell monitoring devices in the communications link.

The present invention is not limited by the exemplary embodiments described above, and various other modifications and embodiments will be apparent to those skilled in the art.

What is claimed is:

1. A signalling system for use with a plurality of series connected battery cells, comprising:

first and second cell signalling devices, each to be powered by a respective one or more of said plurality of battery cells; and a communication link for connecting an output terminal of said first cell signalling device to an input terminal of said second cell signalling device;

characterised in that at least one of said first and second cell signalling devices comprises a DC level shift circuit which is operable (i) to receive signals transmitted from an adjacent cell signalling device; (ii) to shift the DC level of the received signals; and (iii) to output the level shifted signals for transmission to said communication link.

2. A signalling system according to claim 1, wherein said DC level shift circuit is operable (i) to receive signals from an adjacent cell signalling device which is to be powered by a cell having a higher ground potential than that of the receiving cell signalling device; (ii) to decrease the DC level of the received signals; and (iii) to output the level shifted signals for transmission to said communication link.

3. A signalling system according to claim 1, wherein said DC level shift circuit is operable (i) to receive signals from an adjacent cell signalling device which is to be powered by a cell having a lower ground potential than that of the receiving cell signalling device; (ii) to increase the DC level of the received signals; and (iii) to output the level shifted signals for transmission to said communication link.

4. A signalling system according to claim 1, wherein each cell signalling device comprises at least one sensor input terminal operable to receive a signal from a sensor, which signal is indicative of a condition of the cell or cells which are to power the cell signalling device.

5. A signalling system according to claim 4, wherein each of said cell signalling devices comprises a sensor input terminal operable to receive a signal from an electrolyte level and/or electrolyte pH sensor, which signal is indicative of the electrolyte level and/or the electrolyte pH of the cell or cells which are to power the cell signalling device.

6. A signalling system according to claim 4, wherein each cell signalling device comprises a sensor input terminal operable to receive a signal from a voltage sensor, which signal is indicative of the voltage of the cell or cells which are to power the cell signalling device.

7. A signalling system according to claim 4, wherein each cell signalling device comprises a sensor input terminal which is operable to receive a signal from a temperature sensor, which signal is indicative of the temperature of the cell or cells which are to power the cell signalling device.

8. A signalling system according to claim 4, wherein each cell signalling device comprises a sensor input terminal operable to receive a signal from a voltage interconnection sensor, which signal is indicative of the voltage drop between the cell which is to power said cell signalling device and its adjacent cells.

9. A signalling system according to claim 1, wherein each cell signalling device comprises two of said DC level shift circuits, one of which is operable (i) to receive signals from an adjacent cell signalling device which is to be powered by a cell having a higher ground potential than that of the receiving cell signalling device; (ii) to decrease the DC level of the received signals; and (iii) to output the level shifted signals for transmission to said communication link; and the other one of which is operable (i) to receive signals from an adjacent cell signalling device which is to be powered by a cell having a lower ground potential than that of the receiving cell signalling device; (ii) to increase the DC level of the received signals; and (iii) to output the level shifted signals for transmission to said communication link.

10. A signalling system according to claim 9, wherein said communication link comprises a single wire communication bus, and wherein said two DC level shift circuits lie on two separate data transfer paths which are connectable to said single wire communication bus by a switch.

11. A signalling system according to claim 9, wherein said two DC level shift circuits are located on separate data transfer paths, and wherein said communication link comprises a two wire communication bus for connecting the respective data transfer paths with corresponding data transfer paths of an adjacent cell signalling device.

12. A signalling system according to claim 1, further comprising a central battery monitoring system for monitoring the battery as a whole, and wherein each of said cell signalling devices is operable to communicate, via said communication link, with said central battery monitoring system.

13. A signalling system according to claim 12, wherein each cell signalling device comprises:

at least one sensor input terminal operable to receive a signal from a sensor, which signal is indicative of a condition of the cell or cells which are to power the cell signalling device; and a signal generator operable to generate a signal in dependence upon said sensor signal and to output said generated signal for transmission to said central battery monitoring system.

14. A signalling system according to claim 13, wherein said central battery monitoring system is operable to poll each of said plurality of cell signalling devices in turn, and wherein upon being polled, each cell signalling device is operable to return a signal back to said central battery monitoring system via said communication link, which is indicative of said condition of the cell which is to power said cell signalling device.

15. A signalling system according to claim 13, wherein said condition is the cell voltage and wherein said central battery monitoring system is operable to measure the battery charging and discharging current and to calculate the internal resistance of each battery cell by correlating said charging and discharging current with the cell voltages determined by the respective cell signalling devices.

16. A signalling system according to claim 13, wherein said central battery monitoring system is operable to monitor the battery voltage, the battery temperature, the total battery current and the total level of charge.

17. A signalling system according to claim 1, wherein each of said cell signalling devices is operable to receive a control signal from said communication link and comprises a signal generator operable to generate an actuation signal in dependence upon said received control signal and to output said generated actuation signal for controlling an actuator.

18. A signalling system according to claim 17, further comprising a central battery control system for transmitting said control signal to said communication link.

19. A signalling system according to claim 17, wherein each cell signalling device comprises a sensor input terminal operable to receive a signal from an electrolyte level and/or electrolyte pH sensor, which signal is indicative of the electrolyte level and/or the electrolyte pH of the cell or cells which are to power the cell signalling device, and wherein upon receiving said control signal said cell signalling device is operable to output an actuation signal in dependence upon said sensor signal for controlling the addition of water and acid to the cell in order to control its electrolyte level and/or its electrolyte pH.

20. A signalling system according to claim 17, wherein said actuation signal is for controlling a display.

21. A signalling system according to claim 13, wherein said signal generator comprises a microcontroller which is operable to receive communications from and to transmit communications to said communication link.

22. A signalling system according to claim 21, wherein the microcontrollers of said signalling devices are independently addressable so that communications can be directed to a selected one or more of said cell signalling devices via said communication link.

23. A signalling system according to claim 22, wherein the microcontrollers of said cell signalling devices are operable to communicate with each other.

24. A signalling system according to claim 1, wherein said DC level shift circuit comprises a comparator.

25. A signalling system according to claim 24, wherein said comparator comprises a voltage comparator.

26. A signalling system according to claim 25, wherein the communications transmitted over said communication link comprise square wave signals, and wherein each of said comparators is arranged to compare said square wave signals with a reference signal which is an approximation of the ground potential of the adjacent cell signalling device which transmitted the received square wave signals and to output a square wave signal in dependence upon whether or not the received square wave signal is greater or less than said reference signal.

27. A signalling system according to claim 24, wherein said comparator comprises a current comparator.

28. A signalling system according to claim 24, wherein alternate voltage to current comparators and current to voltage comparators are used in adjacent cell signalling devices.

29. A signalling system according to claim 1, wherein said DC level shift circuit comprises a switch and wherein said signalling devices comprises means for opening and closing said switch in dependence upon the signal to be transmitted.

30. A signalling system according to claim 29, wherein said switch comprises a transistor.

31. A signalling system according to claim 30, wherein a source electrode of said switch is connected to a ground potential of one of said first and second cell signalling devices, wherein a drain electrode of said switch is connected to a positive terminal of the other one of said first and second cell signalling devices, wherein said means for opening and closing said switch operates on a gate electrode of the switch in dependence upon the signal to be transmitted to the other cell signalling device and wherein said other cell signalling device comprises means for sensing the change in impedance of said transistor switch.

32. A signalling system according to claim 31, wherein said sensing means comprises a current sensor for sensing the variation of current drawn by said switch as it is opened and closed.

33. A signalling system according to claim 31, wherein said sensing means comprises a voltage divider connected in series with said switch for sensing the change in voltage across the switch as it is opened and closed.

34. A signalling system according to claim 1, wherein each cell signalling device comprises a DC to DC convertor which is operable to convert the cell voltage of the cell which is to power the cell signalling device, to supply voltages and a ground voltage for powering the cell signalling device.

35. A signalling system according to claim 1, wherein a cell signalling device is provided for each of said series connected battery cells.

36. A signalling system according to claim 1, wherein one or more of said series connected battery cells are connected in parallel with one or more additional battery cells.

37. A cell signalling device for use in a signalling system according to claim 1, comprising:
  a power input terminal connectable to the cell or cells which is or are to power said cell signalling device; and
  at least one DC level shift circuit which is operable (i) to receive signals transmitted from an adjacent cell signalling device; (ii) to shift the DC level of the received signals; and (iii) to output the level shifted signals for transmission to the communication link forming part of said signalling system.

38. A signalling kit for use in a signalling system according to claim 1, comprising a plurality of cell signalling devices each of which comprises:
  a power input terminal connectable to the cell or cells which is or are to power said cell signalling device; and
  at least one DC level shift circuit which is operable (i) to receive signals transmitted from an adjacent cell signalling device; (ii) to shift the DC level of the received signals; and (iii) to output the level shifted signals for transmission to the communication link forming part of said signalling system.

39. A signalling kit according to claim 38, further comprising a communication link for connecting said plurality of cell signalling devices in series.

40. A signalling system according to claim 1 in combination with a plurality of series connected battery cells, wherein one or more of said battery cells are connected to a respective one of said plurality of cell signalling devices, for powering said cell signalling devices.

41. A cell signalling device according to claim 37 in combination with a battery cell, wherein the terminals of said battery cell are connectable to said cell signalling device.

42. A signalling method using a plurality of series connected battery cells, comprising the steps of:
  providing a plurality of cell signalling devices and powering them with a respective one or more of said plurality of battery cells;
  providing a communication link for connecting said plurality of cell signalling devices in series;
  receiving signals transmitted from an adjacent cell signalling device;
  shifting the DC level of the received signals; and
  outputting the level shifted signals to the communication link.

* * * * *